United States Patent
Grimbergen

(10) Patent No.: US 8,092,695 B2
(45) Date of Patent: Jan. 10, 2012

(54) ENDPOINT DETECTION FOR PHOTOMASK ETCHING

(75) Inventor: Michael Grimbergen, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 851 days.

(21) Appl. No.: 11/926,482

(22) Filed: Oct. 29, 2007

(65) Prior Publication Data

US 2009/0014409 A1    Jan. 15, 2009

Related U.S. Application Data

(60) Provisional application No. 60/863,490, filed on Oct. 30, 2006, provisional application No. 60/969,328, filed on Aug. 31, 2007.

(51) Int. Cl.
*C23F 1/02* (2006.01)
(52) U.S. Cl. .......................... 216/12; 216/60
(58) Field of Classification Search .............. 216/59, 216/12, 60; 438/FOR. 101, FOR. 142
See application file for complete search history.

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,413,022 A | 11/1983 | Suntola et al. | |
| 4,834,831 A | 5/1989 | Nishizawa et al. | |
| 4,993,357 A | 2/1991 | Scholz | |
| 5,225,366 A | 7/1993 | Yoder | |
| 5,281,274 A | 1/1994 | Yoder | |
| 5,294,286 A | 3/1994 | Nishizawa et al. | |
| 5,360,738 A | 11/1994 | Jones et al. | |
| 5,374,570 A | 12/1994 | Nasu et al. | |
| 5,441,703 A | 8/1995 | Jurgensen | |
| 5,443,647 A | 8/1995 | Aucoin et al. | |
| 5,480,818 A | 1/1996 | Matsumoto et al. | |
| 5,483,919 A | 1/1996 | Yokoyama et al. | |
| 5,503,875 A | 4/1996 | Imai et al. | |
| 5,674,786 A | 10/1997 | Turner et al. | |
| 5,711,811 A | 1/1998 | Suntola et al. | |
| 5,724,144 A * | 3/1998 | Muller et al. | 356/632 |
| 5,796,116 A | 8/1998 | Nakata et al. | |
| 5,807,792 A | 9/1998 | Ilg et al. | |
| 5,835,677 A | 11/1998 | Li et al. | |
| 5,855,680 A | 1/1999 | Soininen et al. | |
| 5,866,795 A | 2/1999 | Wang et al. | |
| 5,879,459 A | 3/1999 | Gadgil et al. | |

(Continued)

FOREIGN PATENT DOCUMENTS

EP    1 167 569    1/2002

(Continued)

OTHER PUBLICATIONS

Official Letter dated Feb. 5, 2010, from Chinese Patent Office for corresponding Chinese Patent application 200710165355.6.

(Continued)

*Primary Examiner* — Allan Olsen
(74) *Attorney, Agent, or Firm* — Patterson & Sheridan, L.L.P.

(57) ABSTRACT

Apparatus and method for endpoint detection are provided for photomask etching. The apparatus provides a plasma etch chamber with a substrate support member. The substrate support member has at least two optical components disposed therein for use in endpoint detection. Enhanced process monitoring for photomask etching are achieved by the use of various optical measurement techniques for monitoring at different locations of the photomask.

6 Claims, 24 Drawing Sheets

U.S. PATENT DOCUMENTS

| | | | |
|---|---|---|---|
| 5,916,365 A | 6/1999 | Sherman | |
| 5,923,056 A | 7/1999 | Lee et al. | |
| 6,015,590 A | 1/2000 | Suntola et al. | |
| 6,015,917 A | 1/2000 | Bhandari et al. | |
| 6,042,652 A | 3/2000 | Hyun et al. | |
| 6,084,302 A | 7/2000 | Sandhu | |
| 6,124,158 A | 9/2000 | Dautartas et al. | |
| 6,139,700 A | 10/2000 | Kang et al. | |
| 6,144,060 A | 11/2000 | Park et al. | |
| 6,153,115 A * | 11/2000 | Le et al. | 216/60 |
| 6,159,297 A | 12/2000 | Herchen et al. | |
| 6,174,377 B1 | 1/2001 | Doering et al. | |
| 6,174,809 B1 | 1/2001 | Kang et al. | |
| 6,183,563 B1 | 2/2001 | Choi et al. | |
| 6,197,683 B1 | 3/2001 | Kang et al. | |
| 6,200,893 B1 | 3/2001 | Sneh | |
| 6,203,613 B1 | 3/2001 | Gates et al. | |
| 6,207,487 B1 | 3/2001 | Kim et al. | |
| 6,231,672 B1 | 5/2001 | Choi et al. | |
| 6,270,572 B1 | 8/2001 | Kim et al. | |
| 6,284,646 B1 | 9/2001 | Leem | |
| 6,287,965 B1 | 9/2001 | Kang et al. | |
| 6,305,314 B1 | 10/2001 | Sneh et al. | |
| 6,306,216 B1 | 10/2001 | Kim et al. | |
| 6,342,277 B1 | 1/2002 | Sherman | |
| 6,348,376 B2 | 2/2002 | Lim et al. | |
| 6,358,829 B2 | 3/2002 | Yoon et al. | |
| 6,372,598 B2 | 4/2002 | Kang et al. | |
| 6,379,748 B1 | 4/2002 | Bhandari et al. | |
| 6,391,785 B1 | 5/2002 | Satta et al. | |
| 6,399,491 B2 | 6/2002 | Jeon et al. | |
| 6,406,924 B1 * | 6/2002 | Grimbergen et al. | 438/9 |
| 6,416,577 B1 | 7/2002 | Suntoloa et al. | |
| 6,416,822 B1 | 7/2002 | Chiang et al. | |
| 6,428,859 B1 | 8/2002 | Chiang et al. | |
| 6,447,607 B2 | 9/2002 | Soininen et al. | |
| 6,451,119 B2 | 9/2002 | Sneh et al. | |
| 6,451,695 B2 | 9/2002 | Sneh | |
| 6,468,924 B2 | 10/2002 | Lee et al. | |
| 6,475,276 B1 | 11/2002 | Elers et al. | |
| 6,475,910 B1 | 11/2002 | Sneh | |
| 6,478,872 B1 | 11/2002 | Chae et al. | |
| 6,481,945 B1 | 11/2002 | Hasper et al. | |
| 6,482,262 B1 | 11/2002 | Elers et al. | |
| 6,482,733 B2 | 11/2002 | Raaijmakers | |
| 6,511,539 B1 | 1/2003 | Raaijmakers | |
| 6,551,406 B2 | 4/2003 | Kilpi | |
| 6,843,881 B2 * | 1/2005 | Kim et al. | 156/345.25 |
| 2001/0000866 A1 | 5/2001 | Sneh et al. | |
| 2001/0002280 A1 | 5/2001 | Sneh | |
| 2001/0009140 A1 | 7/2001 | Bondestam et al. | |
| 2001/0009695 A1 | 7/2001 | Saanila et al. | |
| 2001/0011526 A1 | 8/2001 | Doering et al. | |
| 2001/0013312 A1 | 8/2001 | Soininen et al. | |
| 2001/0014371 A1 | 8/2001 | Kilpi | |
| 2001/0024387 A1 | 9/2001 | Raaijmakers et al. | |
| 2001/0025979 A1 | 10/2001 | Kim et al. | |
| 2001/0028924 A1 | 10/2001 | Sherman | |
| 2001/0034123 A1 | 10/2001 | Jeon et al. | |
| 2001/0041250 A1 | 11/2001 | Werkhoven et al. | |
| 2001/0042523 A1 | 11/2001 | Kesala | |
| 2001/0042799 A1 | 11/2001 | Kim et al. | |
| 2001/0054377 A1 | 12/2001 | Lindfors et al. | |
| 2001/0054730 A1 | 12/2001 | Kim et al. | |
| 2001/0054769 A1 | 12/2001 | Raaijmakers et al. | |
| 2002/0000196 A1 | 1/2002 | Park | |
| 2002/0000598 A1 | 1/2002 | Kang et al. | |
| 2002/0007790 A1 | 1/2002 | Park | |
| 2002/0009544 A1 | 1/2002 | McFeely et al. | |
| 2002/0020869 A1 | 2/2002 | Park et al. | |
| 2002/0021544 A1 | 2/2002 | Cho et al. | |
| 2002/0031618 A1 | 3/2002 | Sherman | |
| 2002/0041931 A1 | 4/2002 | Suntola et al. | |
| 2002/0048635 A1 | 4/2002 | Kim et al. | |
| 2002/0052097 A1 | 5/2002 | Park | |
| 2002/0066411 A1 | 6/2002 | Chiang et al. | |
| 2002/0068458 A1 | 6/2002 | Chiang et al. | |
| 2002/0073924 A1 | 6/2002 | Chiang et al. | |
| 2002/0076481 A1 | 6/2002 | Chiang et al. | |
| 2002/0076507 A1 | 6/2002 | Chiang et al. | |
| 2002/0076508 A1 | 6/2002 | Chiang et al. | |
| 2002/0076837 A1 | 6/2002 | Hujanen et al. | |
| 2002/0082296 A1 | 6/2002 | Verschoor et al. | |
| 2002/0086106 A1 | 7/2002 | Park et al. | |
| 2002/0092471 A1 | 7/2002 | Kang et al. | |
| 2002/0094689 A1 | 7/2002 | Park | |
| 2002/0098627 A1 | 7/2002 | Pomarede et al. | |
| 2002/0104481 A1 | 8/2002 | Chiang et al. | |
| 2002/0106536 A1 | 8/2002 | Lee et al. | |
| 2002/0134307 A1 | 9/2002 | Choi | |
| 2002/0144655 A1 | 10/2002 | Chiang et al. | |
| 2002/0144657 A1 | 10/2002 | Chiang et al. | |
| 2002/0146511 A1 | 10/2002 | Chiang et al. | |
| 2002/0155722 A1 | 10/2002 | Satta et al. | |
| 2002/0162506 A1 | 11/2002 | Sneh et al. | |
| 2002/0164421 A1 | 11/2002 | Chiang et al. | |
| 2002/0164423 A1 | 11/2002 | Chiang et al. | |
| 2002/0177282 A1 | 11/2002 | Song | |
| 2002/0182320 A1 | 12/2002 | Leskela et al. | |
| 2002/0187256 A1 | 12/2002 | Elers et al. | |
| 2002/0197402 A1 | 12/2002 | Chiang et al. | |
| 2003/0004723 A1 | 1/2003 | Chihara | |
| 2003/0013320 A1 | 1/2003 | Kim et al. | |
| 2003/0031807 A1 | 2/2003 | Elers et al. | |
| 2003/0042630 A1 | 3/2003 | Babcoke et al. | |
| 2003/0049942 A1 | 3/2003 | Haukka et al. | |
| 2003/0072975 A1 | 4/2003 | Shero et al. | |
| 2003/0075273 A1 | 4/2003 | Kilpela et al. | |
| 2003/0075925 A1 | 4/2003 | Lindfors et al. | |
| 2003/0176000 A1 * | 9/2003 | Otsubo et al. | 438/14 |
| 2003/0201162 A1 * | 10/2003 | Liu et al. | 204/192.13 |
| 2004/0165177 A1 | 8/2004 | Katz et al. | |
| 2004/0221957 A1 | 11/2004 | Ludviksson | |
| 2005/0067103 A1 | 3/2005 | Nguyen et al. | |
| 2005/0082476 A1 | 4/2005 | Hiroi et al. | |
| 2005/0134834 A1 | 6/2005 | Davis et al. | |
| 2005/0142991 A1 | 6/2005 | Nakao et al. | |
| 2006/0262324 A1 * | 11/2006 | Hays et al. | 356/519 |

FOREIGN PATENT DOCUMENTS

| | | |
|---|---|---|
| GB | 2 355 727 | 5/2001 |
| JP | 57149732 | 9/1982 |
| JP | 58098917 | 6/1983 |
| JP | 4291916 | 10/1992 |
| JP | 5047666 | 2/1993 |
| JP | 5206036 | 8/1993 |
| JP | 5234899 | 9/1993 |
| JP | 5270997 | 10/1993 |
| JP | 6224138 | 8/1994 |
| JP | 10-298787 A | 11/1998 |
| JP | 10298787 | 11/1998 |
| JP | 11058225 | 3/1999 |
| JP | 2000319772 | 11/2000 |
| JP | 2001020075 | 1/2001 |
| JP | 2001111000 | 4/2001 |
| JP | 2001-176851 A | 6/2001 |
| JP | 2001160576 | 6/2001 |
| JP | 2001172767 | 6/2001 |
| JP | 2001176851 A * | 6/2001 |
| JP | 2001217227 | 8/2001 |
| JP | 2002-184755 A | 6/2002 |
| JP | 2002184755 | 6/2002 |
| JP | 2002184755 A * | 6/2002 |
| WO | WO-96/17107 | 6/1996 |
| WO | WO-99/01595 | 1/1999 |
| WO | WO-99/29924 | 6/1999 |
| WO | WO-99/65064 | 12/1999 |
| WO | WO-0016377 | 3/2000 |
| WO | WO-00/54320 | 9/2000 |
| WO | WO-00/79576 | 12/2000 |
| WO | WO-01/15220 | 3/2001 |
| WO | WO-01/17692 | 3/2001 |
| WO | WO-01/27346 | 4/2001 |
| WO | WO-01/27347 | 4/2001 |
| WO | WO-01/29280 | 4/2001 |
| WO | WO-01/29891 | 4/2001 |
| WO | WO-01/29893 | 4/2001 |

| | | |
|---|---|---|
| WO | WO-01/36702 | 5/2001 |
| WO | WO 01/66832 | 9/2001 |
| WO | WO 02/08485 | 1/2002 |
| WO | WO 02/08488 | 1/2002 |
| WO | WO 02/43115 | 5/2002 |
| WO | WO 02/45167 | 6/2002 |

OTHER PUBLICATIONS

European Office Action dated Jan. 30, 2009 for Application No. 07021045.5.
Extended European search report for EP 07 02 1045, dated Apr. 29, 2008, copy consists of 7 pages.
Notice to File a Response for KR-10-2007-0108159, Oct. 20, 2008, copy consists of 4 pages.
Prosecution history of U.S. Appl. No. 11/926,417, as of Nov. 4, 2010.
Prosecution history of U.S. Appl. No. 11/844,868, as of Nov. 4, 2010.
Prosecution history of U.S. Appl. No. 11/844,838, as of Nov. 4, 2010.
Official Letter dated Mar. 4, 2011, from European Patent Office for corresponding European Patent Application No. 11152646.3-2222.
Prosecution history of U.S. Appl. No. 11/844,838 as of Jan. 18, 2011.
Prosecution history of U.S. Appl. No. 11/844,868 as of Jan. 18, 2011.
Prosecution history of U.S. Appl. No. 11/926,417 as of Jan. 18, 2011.
Prosecution history of U.S. Appl. No. 11/926,417 as of Jun. 24, 2011.
Prosecution history of U.S. Appl. No. 11/844,838 as of Jun. 24, 2011.
Prosecution history of U.S. Appl. No. 11/844,868 as of Jun. 24, 2011.
European Search Report for corresponding European Patent Application No. EP 11 15 2646, dated Feb. 23, 2011.
Official letter from the Chinese Patent Office for corresponding Chinese Patent Application No. 200710165355.6 dated Apr. 13, 2011.
J.P. Stagg, J. Christer, E. J. Thrush and J. Crawley, "Measurement and Control of Reagent Concentrations in MOCVD Reactor Using Ultrasonics," Journal of Crystal Growth 120(1992) pp. 98-102.
"MultiGas™ 2030," MKS Instruments, Inc., Bulletin 2030-04/02.
Kukli, et al., "Tailoring the Dielectric Properties of $HfO_2$-$Ta_2$-$O_5$ Nanolaminates," Applied Physics Letters, vol. 68, No. 26, Jun. 24, 1996; p. 3737-9.
Kukli, et al., "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670-5.

Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236-42.
Kukli, et al., "Properties of $Ta_2O_5$-Based Dielectric Nanolaminates Deposited by Atomic Layer Epitaxy," Journal of the Electrochemical Society, vol. 144, No. 1, Jan. 1997; p. 300-6.
Kukli, et al., "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," 1997; p. 785-93.
Ritala, M., et al., "Chemical Vapor Deposition," Jan. 1999, p. 6-9.
Rossnagel, et al. "Plasma-enhanced Atomic Layer Deposition of Ta and Ti for Interconnect Diffusion Barriers," J. Vac. Sci. Technol. B., vol. 18, No. 4 (Jul. 2000); p2016-20.
Niinisto, et al."Synthesis of Oxide Thin Films and Overlayers by Atomic Layer Epitaxy for Advanced Applications," Materials Science and Engineering B41 (1996) 23-29.
Eisenbraum, et al., "Atomic Layer Deposition (ALD) of Tantalum-based materials for zero thickness copper barrier applications," Proceedings of the IEEE 2001 International Interconnect Technology Conference (Cat. No. 01EX461) 2001.
Clark-Phelps, et al., "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).
Yi-Chiau Huang, et al., "Extended Chamber Matching and Repeatability Study for Chrome Etch", Proceedings of SPIE vol. 4562 21st Annual BACUS Symposium on Photomask Technology, Giang T. Dao, Brian J. Grenon, Editors, Mar. 2002, pp. 1-9.
Melisa J. Buie, et al., "An Endpoint for Photomask Chrome Loads Down to 0.25%", Proceedings of SPIE—vol. 4562 21st Annual BACUS Symposium on Photomask Technology, Giang T. Dao, Brian J. Grenon, Editors, Mar. 2002, pp. 1-8.
Yi-Chiau Huang, et al., "In-situ Optical Emission Spectroscopic Examination of Chrome Etch for Photomasks", Etec Systems, Etch Systems Division, Mask Business Group, pp. 1-14, Proc. SPIE 4754, 312 (2002), Conference Date: Tuesday Apr. 23, 2002.
US 2002/0008570 A1, 08/2002, Lindfors (withdrawn)

* cited by examiner

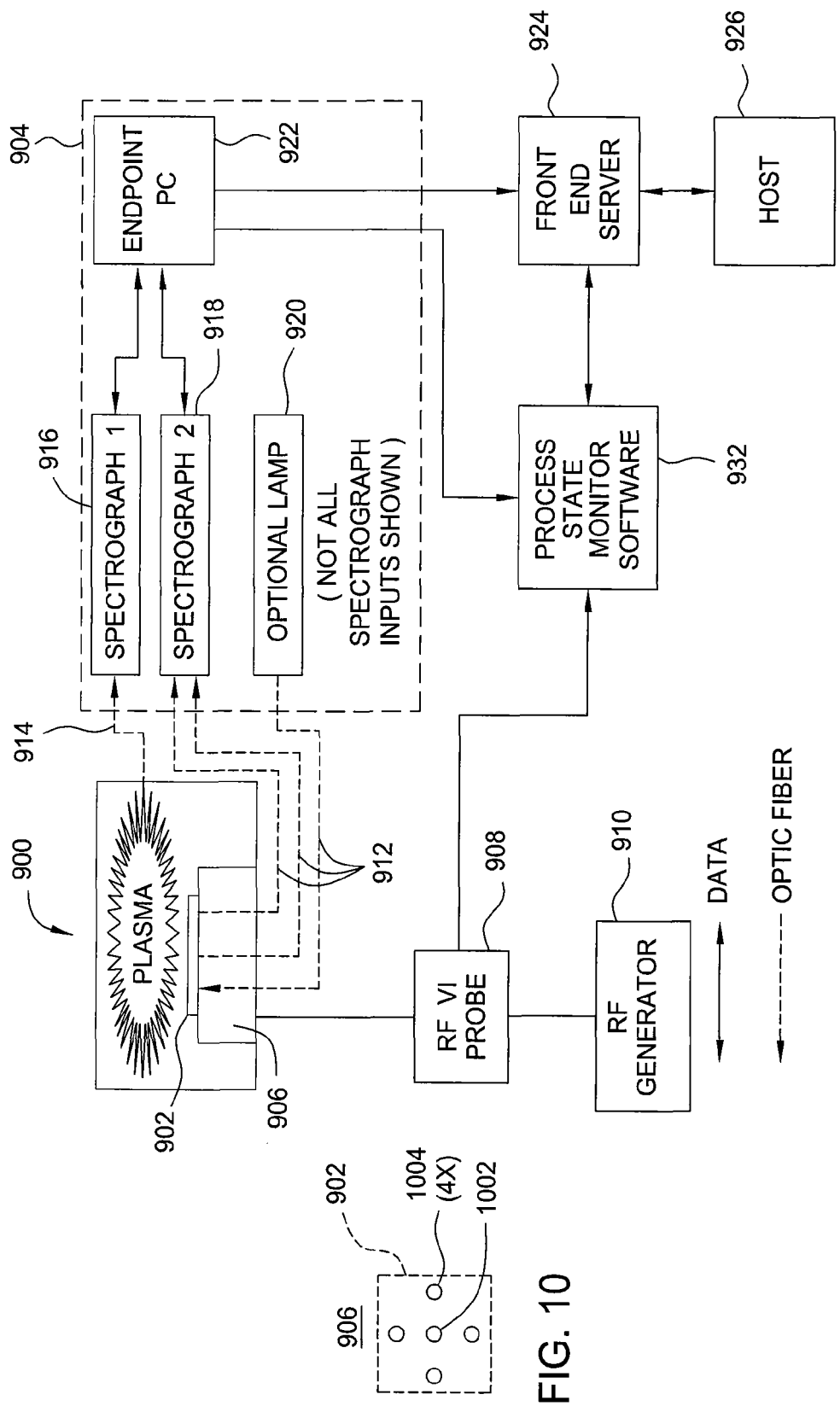

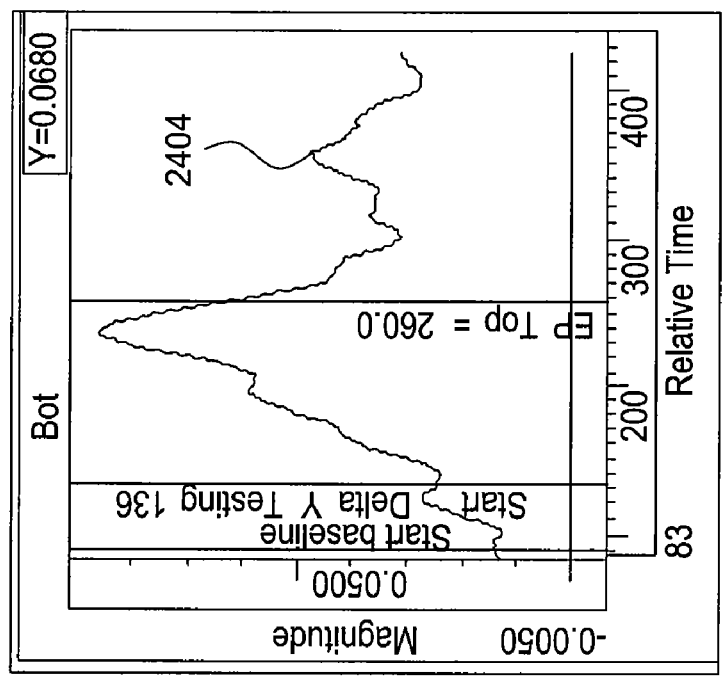
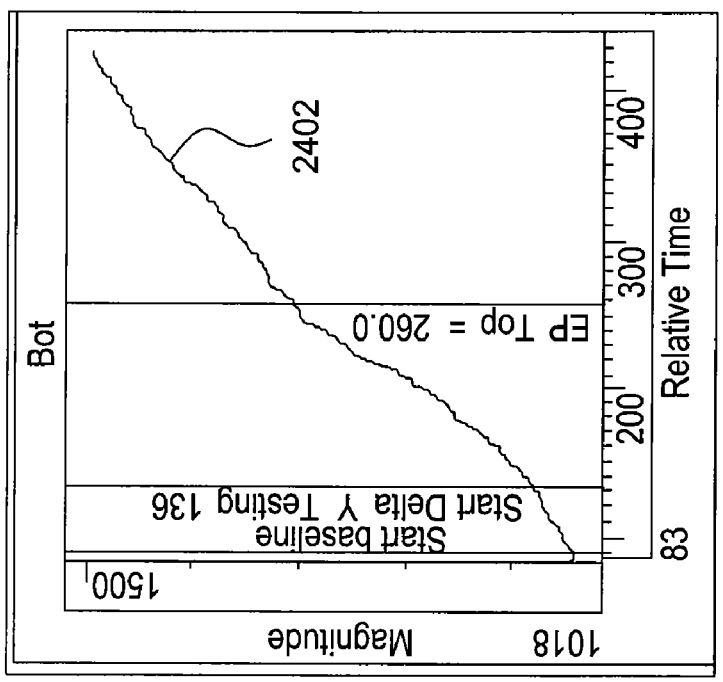
FIG. 24

ENDPOINT DETECTION FOR PHOTOMASK ETCHING

CROSS-REFERENCE TO RELATED APPLICATIONS

This application claims the benefit of U.S. Provisional Application No. 60/863,490 filed Oct. 30, 2006, U.S. Provisional Application No. 60/969,328 filed Aug. 31, 2007. Both of which are herein incorporated by reference there their entireties.

Additionally, the subject matter of this application is related to the subject matter disclosed in U.S. patent application Ser. No. 10/672,420, entitled "Interferometer Endpoint Monitoring Device", filed on Sep. 26, 2003, by Nguyen, et al.; U.S. patent application Ser. No. 11/844,838, entitled "Endpoint Detection for Photomask Etching", filed on Aug. 24, 2007, by Grimbergen; U.S. patent application Ser. No. 11/844,868, entitled "Endpoint Detection for Photomask Etching", filed on Aug. 24, 2007, by Grimbergen; U.S. patent application Ser. No. 11/926,278, entitled "Endpoint Detection for Photomask Etching", filed Oct. 29, 2007, by Grimbergen; and U.S. patent application Ser. No. 11/926,417, entitled "Endpoint Detection for Photomask Etching", filed Oct. 29, 2007, by Grimbergen, all of which are hereby incorporated hereby by reference in their entireties.

BACKGROUND

1. Field of the Invention

Embodiments of the present invention generally relate to the fabrication of integrated circuits and to the fabrication of photomasks useful in the manufacture of integrated circuits.

2. Description of the Related Art

The fabrication of microelectronics or integrated circuit devices typically involves a complicated process sequence requiring hundreds of individual steps performed on semiconductor, dielectric and conductive substrates. Examples of these process steps include oxidation, diffusion, ion implantation, thin film deposition, cleaning, etching and lithography. Using lithography and etching (often referred to as pattern transfer steps), a desired pattern is first transferred to a photosensitive material layer, e.g., a photoresist, and then to the underlying material layer during subsequent etching. In the lithographic step, a blanket photoresist layer is exposed to a radiation source through a reticle or photomask containing a pattern so that an image of the pattern is formed in the photoresist. By developing the photoresist in a suitable chemical solution, portions of the photoresist are removed, thus resulting in a patterned photoresist layer. With this photoresist pattern acting as a mask, the underlying material layer is exposed to a reactive environment, e.g., using wet or dry etching, which results in the pattern being transferred to the underlying material layer.

The pattern on a photomask, which is typically formed in a metal-containing layer supported on a glass or quartz substrate, is also generated by etching through a photoresist pattern. In this case, however, the photoresist pattern is created by a direct write technique, e.g., with an electron beam or other suitable radiation beam, as opposed to exposing the photoresist through a reticle. With the patterned photoresist as a mask, the pattern can be transferred to the underlying metal-containing layer using plasma etching. An example of a commercially available photomask etch equipment suitable for use in advanced device fabrication is the Tetra™ Photomask Etch System, available from Applied Materials, Inc., of Santa Clara, Calif. The terms "mask", "photomask" or "reticle" will be used interchangeably to denote generally a substrate containing a pattern.

During processing, endpoint data from the etching of the photomasks may be used to determine whether the process is operating according to required specifications, and whether the desired results such as etch uniformity are achieved. Since each photomask generally has its own set of features or patterns, different photomasks being etched using the same process recipe may yield different endpoint data, thereby making it difficult to determine if the desired etch results are obtained for a specific photomask.

With ever-decreasing device dimensions, the design and fabrication of photomasks for advanced technology becomes increasingly complex, and control of critical dimensions and process uniformity becomes increasingly more important. Therefore, there is an ongoing need for improved process control in photomask fabrication, such as improved apparatus and method for generating endpoint data that would be consistent for each photomask.

SUMMARY

Embodiments of the invention generally provide a method and apparatus for etching a substrate. The invention is particularly suitable for etching photomasks, among other substrates used vacuum processing.

In one embodiment, a method for etching a substrate is provided that includes (a) providing an etch chamber having a substrate support member, the substrate support member comprising at least a first window in a center region and a second window in a peripheral region, (b) providing a substrate on the substrate support member, (c) introducing a process gas into the etch chamber, (d) generating a plasma from the process gas for etching the substrate, (e) detecting a first optical signal through the first window and a second optical signal through the second window using an endpoint detection system, and terminating the plasma based on information obtained from at least one of the detected first and second optical signals.

In another embodiment, a method for etching a substrate includes (a) providing an etch chamber having a substrate support member, the substrate support member comprising a first window and a second window, (b) providing a substrate on the substrate support member, (c) generating a plasma from a process gas for etching the substrate, (d) providing an endpoint detection system comprising a photodetector, (e) monitoring at least one optical signal through at least one of the first window and the second window using the photodetector, and (f) terminating the plasma based on information obtained from the at least one optical signal.

In another embodiment of the invention, an apparatus for substrate etching is provided that includes a plasma etching chamber, a substrate support member inside the chamber, the substrate support member having a first window disposed in a center region and a second window disposed in a peripheral region, and an endpoint detection system operatively coupled to the chamber through the first and second windows.

In another embodiment, an apparatus for substrate etching may include a plasma etching chamber comprising a substrate support member, an endpoint detection system configured for operating in at least one of a reflection mode and a transmission mode, wherein the endpoint detection system comprises a first optical component disposed in a center region of the substrate support member and a second optical component disposed in a peripheral region of the substrate support member.

Another embodiment provides an apparatus for substrate etching that includes a plasma etching chamber, a substrate support member inside the chamber, the substrate support member having a first window and a second window disposed therein, the first window being in a center region of the support member, and an endpoint detection system operatively coupled to the chamber through one of the first and second windows.

In another embodiment, a method for etching a substrate may include providing an etch chamber having a substrate support member, the substrate support member comprising a first window in a center region and a second window in a peripheral region, providing a substrate on the substrate support member, introducing a process gas into the etch chamber, generating a plasma from the process gas for etching the substrate, detecting a first optical signal through the first window and a second optical signal through the second window using an endpoint detection system, and terminating the plasma based on information obtained from at least one of the detected first and second optical signals.

In another embodiment, a method for processing a substrate includes etching a patterned substrate disposed on a substrate support in a plasma etch chamber, detecting a first signal reflected from the substrate during etching, the first signal collected through a first window of the substrate support, detecting a second signal transmitted through the substrate during etching, the second signal collected through a second window of the substrate support, that second window spatially separated from the first window, and determining an endpoint of the etch process using the first and second signals.

In another embodiment, a method for processing a substrate includes placing a patterned substrate on a substrate support a plasma etch chamber, etching a substrate, and detecting an etching endpoint using a light having a wavelength absorbed by a layer disposed on the substrate.

In another embodiment, a method for processing a substrate includes detecting an orientation of a patterned photomask reticle while disposed on a substrate support in a plasma etch chamber and selecting and/or altering an etch process in response to the detected orientation.

In another embodiment, a method for processing a substrate includes etching a substrate through a patterned masking layer in a plasma etch chamber, the substrate having a non-etching side disposed on a substrate support and an etching side facing away from the substrate support, exposing the etching side of the patterned substrate while etching to radiation from a radiation source while etching the substrate, collecting a signal from the radiation source from the non-etching side of the patterned substrate, and controlling the etch process in response to the collected signal.

In yet another embodiment, a method for etching a substrate includes (a) providing an etch chamber having a substrate support member, the substrate support member having a first window and a second window, (b) providing a substrate on the substrate support member, (d) generating a plasma from a process gas for etching the substrate, (e) providing an endpoint detection system that includes a photodetector, (f) monitoring at least one optical signal through at least one of the first window and the second window using the photodetector, and (g) terminating the plasma based on information obtained from the at least one optical signal.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 9 is a schematic diagram of another embodiment of an etch reactor suitable for etching a photomask reticle having an endpoint detection system;

FIG. 10 is a schematic diagram of a top view of a substrate support illustrating the distribution of a center window and edge windows within an area covered by a reticle during processing;

FIG. 24 depicts an endpoint signal wherein optical interference from a photoresist layer is minimized by utilizing deep UV wavelength monitoring signals, wherein the left graph shows the transmission and the right graph shows its derivative;

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for etching a photomask substrate with enhanced process monitoring, for example, by providing for optical monitoring at different regions of the photomask. Although the discussions and illustrative examples focus on the etching of a photomask substrate, various embodiments of the invention can also be adapted for process monitoring of other suitable substrates, including transparent or dielectric substrates.

Figure 1A:
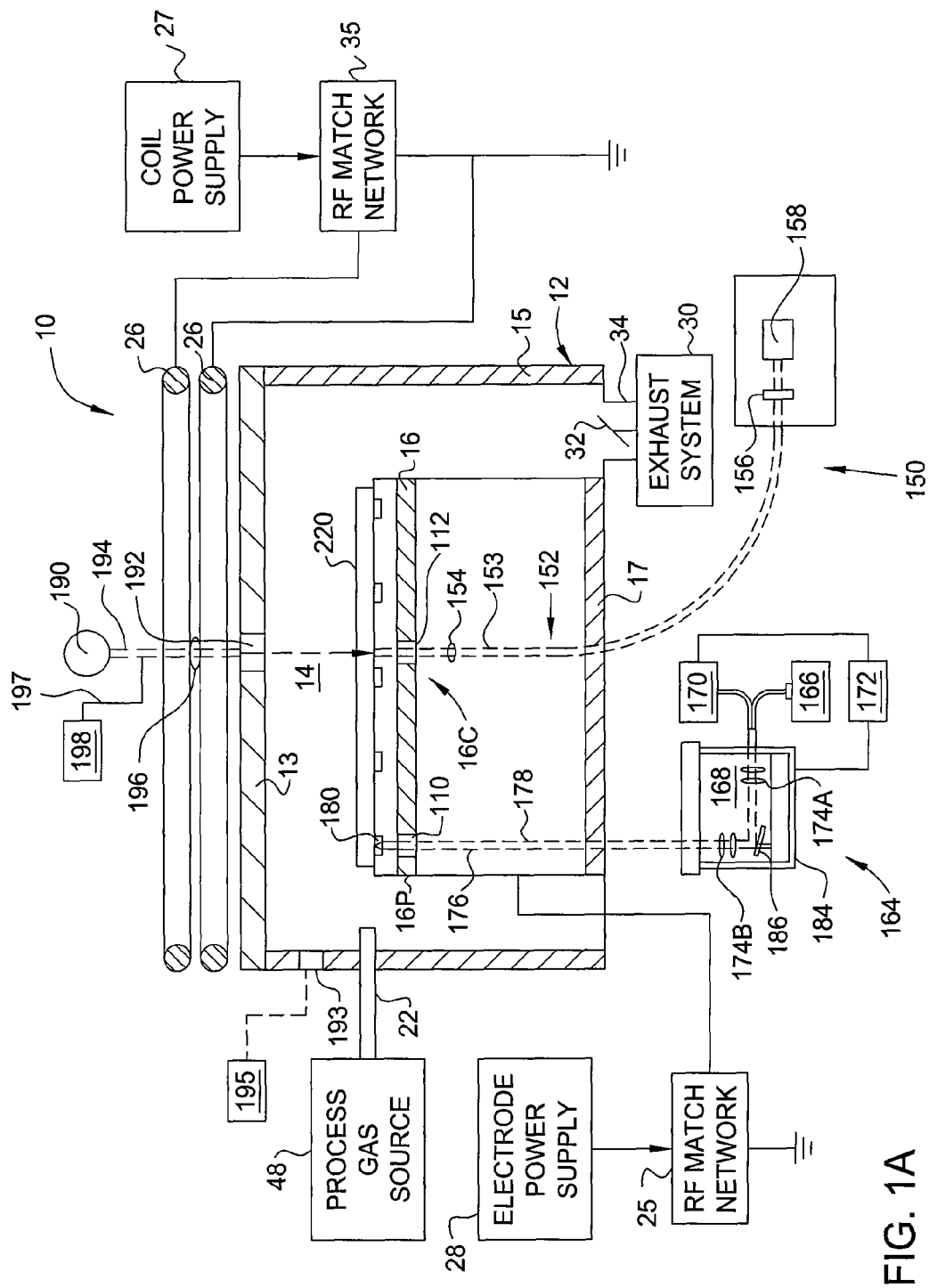
FIG. 1A illustrates a process chamber incorporating one embodiment of the present invention.

FIG. 1A is a schematic cross sectional view of a plasma etch chamber 10 in accordance with one embodiment of the invention. Suitable plasma etch chambers include the Tetra™ II photomask etch chamber or the Decoupled Plasma Source (DPS™) chamber available from Applied Materials, Inc., of Santa Clara, Calif. Other process chambers may also be used in connection with embodiments of the invention, including, for example, capacitive coupled parallel plate chambers and magnetically enhanced ion etch chambers, as well as inductively coupled plasma etch chambers of different designs. The particular embodiment of the etch chamber 10 shown herein is provided for illustrative purposes and should not be used to limit the scope of the invention. It is contemplated that the invention may be utilized in other processing systems, including those from other manufacturers.

The process chamber 10 generally includes a cylindrical sidewall or chamber body 12, an energy transparent ceiling 13 mounted on the body 12, and a chamber bottom 17. The ceiling 13 may be flat, rectangular, arcuate, conical, dome or multi-radius shaped. At least one inductive coil 26 is disposed above at least a portion of the ceiling 13. In the embodiment depicted in FIG. 1A, two concentric coils 26 are shown. The chamber body 12 and the chamber bottom 17 of the process chamber 10 can be made of a metal, such as anodized aluminum, and the ceiling 13 can be made of an energy transparent material such as a ceramic or other dielectric material.

A substrate support member 16 is disposed in the process chamber 10 to support a substrate 220 during processing. The support member 16 may be a conventional mechanical or electrostatic chuck with at least a portion of the support member 16 being electrically conductive and capable of serving as a process bias cathode. While not shown, a photomask adapter may be used to secure the photomask on the support member 16. The photomask adapter generally includes a lower portion milled to cover an upper portion of the support member and a top portion having an opening that is sized and shaped to hold a photomask. In one embodiment, the top portion of the photomask adapter has a square opening. A suitable photomask adapter is disclosed in U.S. Pat. No. 6,251,217, issued on Jun. 26, 2001, which is incorporated herein by reference to the extent not inconsistent with aspects and claims of the invention.

Process gases are introduced into the process chamber 10 from a process gas source 48 through a gas distributor 22 peripherally disposed about the support member 16. Mass flow controllers (not shown) for each process gas, or alternatively, for mixtures of the process gas, are disposed between the process chamber 10 and the process gas source 48 to regulate the respective flow rates of the process gases.

A plasma zone 14 is defined by the process chamber 10, the substrate support member 16 and the ceiling 13. A plasma is generated in the plasma zone 14 from the process gases by supplying power from a power supply 27 to the inductive coils 26 through an RF match network 35. The support member 16 may include an electrode disposed therein, which is powered by an electrode power supply 28 and generates a capacitive electric field in the process chamber 10 through an RF match network 25. Typically, RF power is applied to the electrode in the support member 16 while the body 12 is electrically grounded. The capacitive electric field, which is transverse to the plane of the support member 16, influences the directionality of charged species to provide more anisotropic etching of the substrate 220.

Process gases and etchant byproducts are exhausted from the process chamber 10 through an exhaust port 34 to an exhaust system 30. The exhaust system 30 may be disposed in the bottom 17 of the process chamber 10 or may be disposed in the body 12 of the process chamber 10 for removal of process gases. A throttle valve 32 is provided in the exhaust port 34 for controlling the pressure in the process chamber 10.

FIG. 1A further illustrates an endpoint detection system 164 operatively coupled to the process chamber 10 in accordance with one embodiment of the invention. According to embodiments of the invention, at least two optical access ports or viewports, are provided in different regions of the substrate support member 16. In one embodiment, at least one access port is provided in a non-peripheral region. In yet another embodiment, the substrate support member 16 is provided with at least one window in a center region. In the example shown in FIG. 1A, the two optical access ports comprise respectively a window 110 at a peripheral region 16P, and a window 112 at a central region 16C. The endpoint detection system 164 is configured to detect optical signals through one or more of these windows, which allows optical monitoring of various locations on a photomask substrate 220 from its backside during etching. In one embodiment, a third window (not shown) may also be provided in the peripheral region 16P of the substrate support member 16. Alternatively, different numbers of windows may be provided at other locations of the substrate support member 16.

In general, a larger window facilitates the installation of optical components within the substrate support member 16. However, for apparatus in which the substrate support member 16 is RF biased, the size of the window, especially in the central region 16C of the substrate support member 16, is selected to be sufficiently large for optical monitoring, yet small enough to avoid potential adverse impact for the RF bias. Selecting a small window also improves the lateral temperature uniformity of the support member 16. The optical access port may generally comprise a flat window made of quartz or other materials that transmit light over a broad wavelength spectrum. A more detailed discussion of different optical configurations will be provided in a later section.

Figure 2:
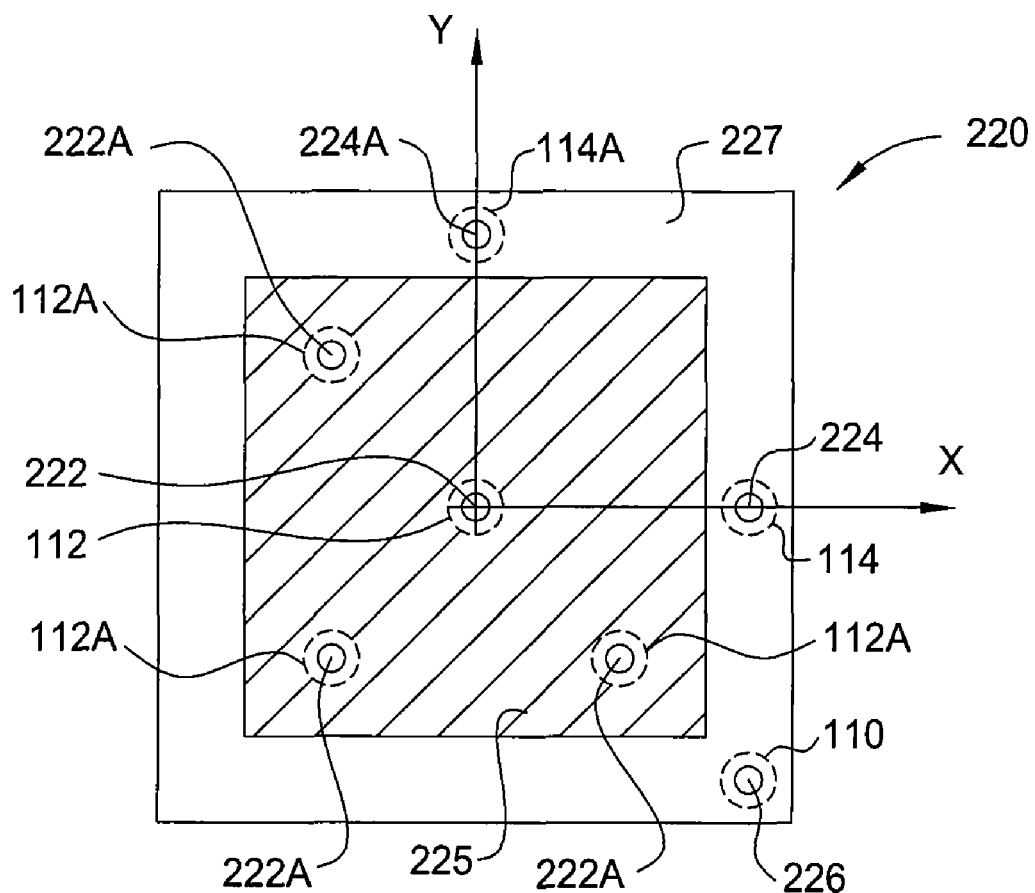
FIG. 2 illustrates sample locations on a substrate for endpoint detection.

Referring first to FIG. 2, FIG. 2 illustrates schematically several locations of the photomask substrate 220 that are monitored for endpoint detection according to one embodiment of the present invention. A central region 225 of the substrate 220 may be defined as the area of the photomask that is patterned for lithographic purposes, while a peripheral region is outside of the patterned central region, and may include patterns or features utilized for endpoint or monitoring of other process parameters. Several windows disposed in the substrate support member 16 are shown in phantom. For example, when the photomask substrate 220 is centrally disposed with respect to the substrate support member 16, optical access through window 112 allows monitoring of an area 222 around the center of the photomask 220, while areas 224 and 226 in a peripheral region 227 of the photomask 220 can be monitored through windows 114 and 110, respectively. In one embodiment, monitored areas 224 and 226 are located respectively along one side and at a corner of the photomask 220. In another embodiment, the monitored area 224 is located on one side of the photomask 220, e.g., at a midpoint of the side, along a x-direction with respect to the center of the photomask 220, while another area 224A located on an adjacent side of the photomask 220, e.g., along a y-direction with respect to the center of the photomask 220, is monitored through another window 114A. Optical signals obtained through windows such as 112, 114 and 114A can be used to obtain center to edge etch uniformity along the x- and y-directions, or more generally, along directions that are perpendicular to each other.

One or more windows 112A may also be provided in the substrate support member 16 to allow for monitoring of different areas such as 222A in the central region 225 of the photomask 220. The additional windows 112A, 114A facilitate determination of an edge to center etch profile. For example, information regarding process uniformity, such as the edge to center etch profile, can be obtained by comparing the endpoint results at different regions or locations of the photomask 220, e.g., based on signals from areas 222, 224 and 224A. The windows may also be used for ensuring that at least one window 112, 122A is below a feature being etched.

Referring back to FIG. 1A, the endpoint detection system 164 comprises optical setup for operating in reflection or transmission modes, and is configured for different types of measurements such as reflectance or transmittance, interferometry, or optical emission spectroscopy. Depending on the application of interest, e.g., the material layers or substrate structure being processed, endpoints may be detected based on a change in the reflectance or transmittance intensities, the number of interference fringes, or changes in optical emission intensities at specific wavelengths, or a combination thereof.

The reflection mode of operation allows reflectance (or reflectometry) and interferometric measurement to be performed. The endpoint system 164 generally comprises an optical source 166, a focusing assembly 168 for focusing an incident optical beam 176 from the optical source 166 onto an area or spot 180 on the backside of substrate 220, and a photodetector 170 for measuring the intensity of a return optical beam 178 reflected off the area 180 of the substrate 220. The photodetector 170 may generally be a single wavelength or multi-wavelength detector, or a spectrometer. Based on the measured signal of the reflected optical beam 178, a computer 172 calculates portions of the real-time waveform and compares it with a stored characteristic waveform pattern to extract information relating to the etch process. In this case, the calculation may be based on slope changes or other characteristic changes in the detected signals, either in reflection or transmission mode, for example, when a film is etched through. Alternatively, the calculation may be based on interferometric signals as the depth of a trench or the thickness of a film changes during etching. In other embodiments, more detailed calculations may be performed based on reflection and transmission data obtained over a wide spectrum in order to determine the depth or thickness at any point in the etch process, or to determine the lateral dimensions of the features being etched.

The light source 166 may be monochromatic, polychromatic, white light, or other suitable light source. In general, the optical signal from the reflected beam 178 may be analyzed to extract information regarding the presence or absence of a layer (e.g., metal-containing layer), or the thickness of certain material layers within the area 180. The intensity of the incident light beam 176 is selected to be sufficiently high to provide a return beam 178 with a measurable intensity. In one embodiment, the light source 166 provides polychromatic light, e.g., from an Hg—Cd, Hg—Ar or Xe lamp or a light emitting diode (LED), which generates light in a wavelength range from about below 200 nm to about above 800 nm, or about 400 to about 800 nm, respectively. The polychromatic light source 166 can be filtered to provide an incident light beam 176 having selected frequencies. Color filters can be placed in front of the light detector 170 to filter out all wavelengths except for the desired wavelength of light, prior to measuring the intensity of the return light beam 178 entering the light detector 170. The light can be analyzed by a spectrometer (array detector with a wavelength-dispersive element) to provide data over a wide wavelength range, such as ultraviolet to visible, from about 200 nm to 800 nm. The light source may be configured to operate in a continuous or pulsed mode. With continuous detection, it is preferable to have a light source with an output intensity that is higher than that of the plasma emission. In the case of a light source with multiple wavelength outputs, one can select a wavelength whose intensity is higher than that of the corresponding wavelength from the plasma. For pulsed mode operation, such requirements of the light source intensity may be relaxed, as long as the detector is not saturated by the intensity from the light source and plasma.

Various light source options are available for pulsed mode operation. For example, the light source 166 may be any suitable source that provides a steady or continuous radiation output. A shutter (not shown) can be provided to block and unblock the output beam from the light source 166 so as to provide alternate beam off/on cycles for signal detection. A signal acquired during the beam "on" period will include contributions from the plasma emission and the signal induced by the light source 166, while a signal acquired during the beam "off" period will correspond to the plasma emission. Subtracting the beam "off" signal from the beam "on" signal can result in improved measurement because potential interference from the plasma emission can be eliminated. Such a data subtraction routine can be provided as part of algorithm associated with the endpoint detection system.

Figure 7:
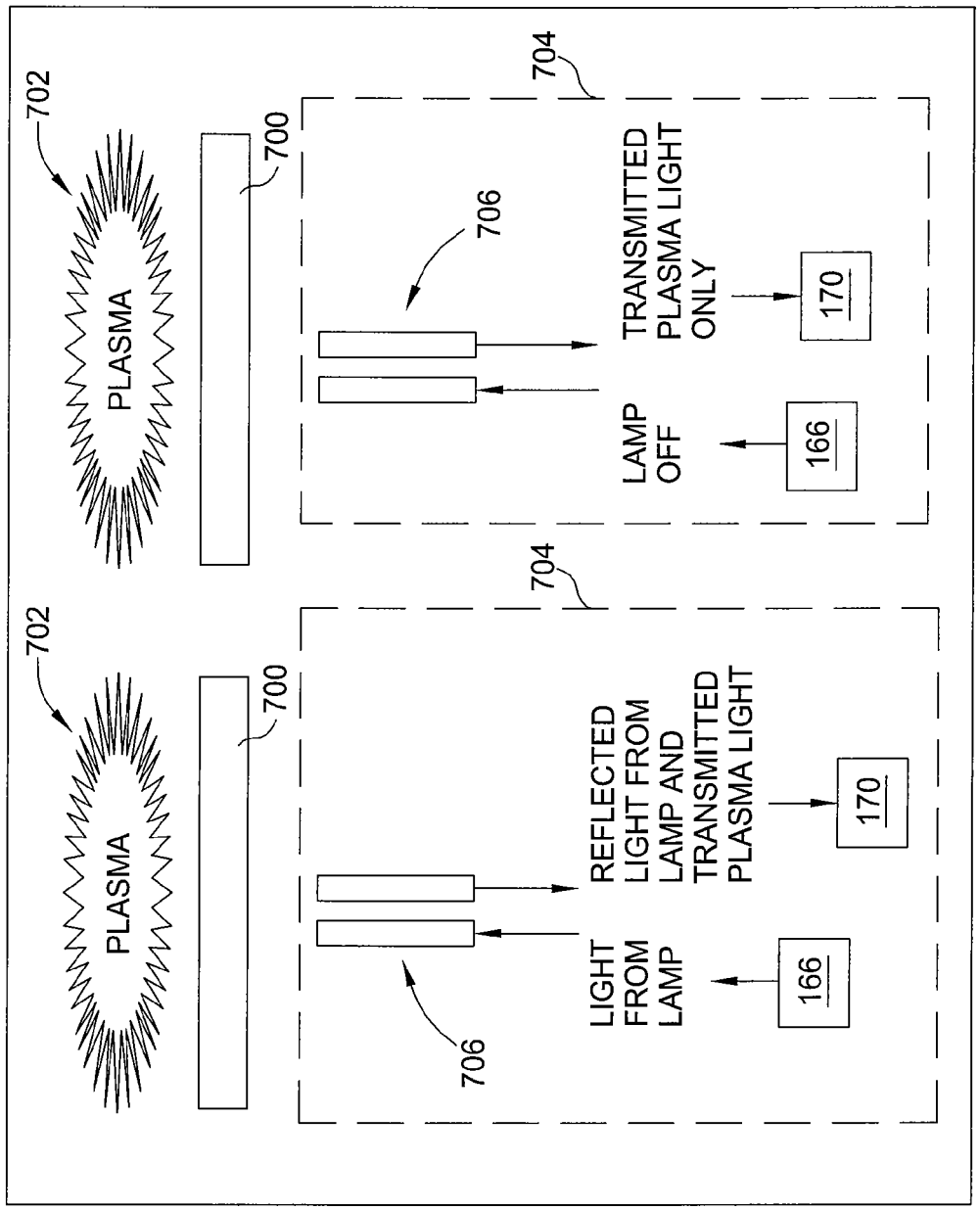
FIG. 7 is a schematic diagram of another embodiment of an etch chamber having an endpoint detection system that includes an optical fiber bundle.

Pulsed mode operation may also be achieved by configuring the light source 166 to be switched on and off in alternate cycles, for example, as shown in FIG. 7. In the embodiment of FIG. 7, a reticle 700 is positioned in an etch chamber below a plasma 702. An endpoint detection system 704 is positioned to interface with the bottom of the reticle 700. The endpoint detection system 704 includes an optical fiber bundle 706 having one end positioned to view the bottom of the reticle 700 through one or more windows formed in the substrate support (not shown). The optical fiber bundle 706 carries a signal generated from the light source 166 and reflected off the reticle 700 to a detector 170. In general, the shuttering or switching of the light source can be performed at various combinations of duty cycles and signal acquisition times, e.g., with the light source duty cycle selected to match that of the detector duty cycle for background subtraction. The light source intensity may also be adjustable to avoid saturating the detector 170, such as a charge-coupled device (CCD) or other suitable device. If the pulse duration is shorter than the detector sampling time, the lamp may be pulsed a number of times to form a higher total intensity by integration. In one embodiment, a 50 percent duty cycle is used. When the light source is on (or shutter is open), light sensed by the detector includes both light from the lamp and from the plasma. When the light source is off (or shutter is closed), light sensed by the detector includes only light from the plasma. Utilizing the difference in the signals, the background contribution of light from the plasma may be subtracted the detected signal, thereby providing a more accurate endpoint indication.

Alternatively, unequal sampling periods may also be used for background subtraction. For example, the sampling time for the detector, e.g., a CCD, can be kept short during the light source "on" period, followed by a longer sampling time during the light source "off" period, during which the background plasma emission is collected. This may be useful for reducing the noise in the background plasma emission if the emission itself is used as a secondary signal, e.g., as in transmission monitoring.

The selection of the signal acquisition time and the light source "on" period may depend on the specific application and the intensity of the light source. In general, using a light source with a relatively low intensity output will require a longer signal acquisition time. In one embodiment, the beam "on" period can range from about 0.1 second to about 2 seconds.

The light source 166 may be a monochromatic source that provides optical emission at a selected wavelength, for example, a He—Ne or ND-YAG laser, or a solid state source such as a light emitting diode (LED). Other options include various discharge lamps such as hydrogen ($H_2$), deuterium ($D_2$), vapor lamps such as those disclosed in Grimbergen, U.S. Pat. No. 6,534,756, or hollow cathode lamps, with radiation outputs at multiple wavelengths. In one embodiment, the light source 166 includes a number of LEDs providing radiation outputs at different wavelength regions. For example, the light source 166 may include at least one of the following: a LED in the ultraviolet (UV) region, a LED in the infrared (IR) region, and a LED with broadband (e.g., white light) output, or any combinations thereof. Using a combination of LEDs with different output wavelengths, e.g., 370 nm (UV), 390 nm (UV), 400-700 nm (white), 800 nm (IR), 1300 nm (IR), 1500 nm (IR), spectral output from the UV to the IR region can be achieved, e.g., from about 350 nm to about 1500 nm. In this case, the light source 166 can be provided with an output fiber bundle with fibers coupling to respective LEDs.

Figure 1B:
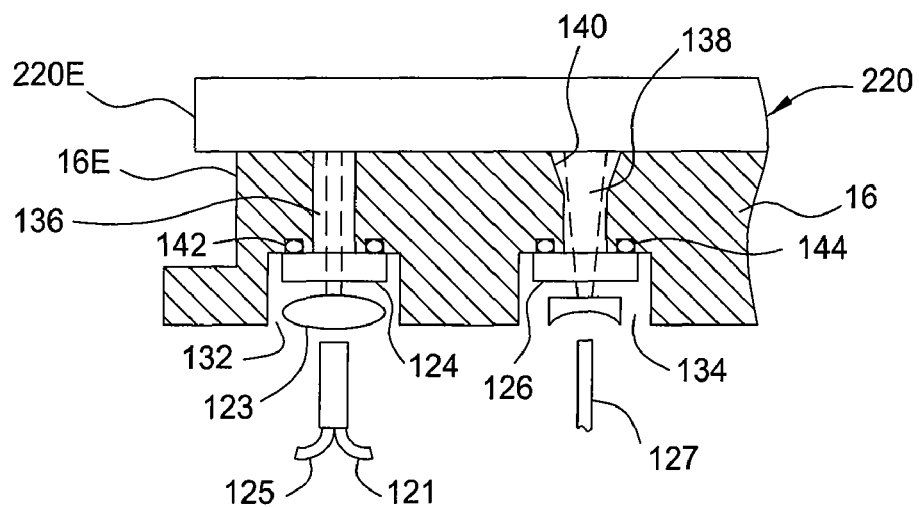
FIG. 1B illustrates a cross-sectional view of two optical configurations for endpoint monitoring according to embodiments of the present invention.

Referring back to the embodiments depicted in FIG. 1A, one or more convex focusing lenses 174a, 174b may be used to focus the incident light beam 176 to the area 180 on the substrate surface, and to focus the return light beam 178 back on the active surface of light detector 170. The area 180 should be sufficiently large to compensate for variations in surface topography of the substrate 220 and device design features. This enables detection of etch endpoints for high aspect ratio features having small openings, such as vias or deep narrow trenches, which may be densely present or more isolated. The area of the return light beam should be sufficiently large to activate a large portion of the active light-detecting surface of the light detector 170. The incident and return light beams 176, 178 are directed through a transparent window 110 in the process chamber 10 that allows the light beams to pass in and out of the processing environment. Although lenses 172a and 174b are shown in FIG. 1A as mounted away from the window 110, in practice, they may also be mounted close to the window 110, as shown in FIG. 1B. It is also understood that the incident and return light beams 176, 178 can generally be coupled via optical fibers to the endpoint detection system 164. The use of fiber optics for coupling light beams to and from the windows also allows electrical isolation to be maintained between the substrate support member 16 and the detector electronics.

The diameter of the beam spot 180 is generally about 2 mm to about 10 mm. However, if the beam spot 180 encompasses large isolated areas of the substrate containing only a small number of etched features, it may be necessary to use a larger beam spot in order to encompass a greater number of etched features. The size of the beam spot can therefore be optimized, depending on the design features for a particular device. If the signal is sufficient, a large beam spot or field of view will enable process control without precisely matching the position of the substrate support hole and the etched area of the substrate giving rise to the signal.

Optionally, a light beam positioner 184 may be used to move the incident light beam 176 across the substrate 220 to locate a suitable portion of the substrate surface on which to position the beam spot 180 to monitor an etching process. The light beam positioner 184 may include one or more primary mirrors 186 that rotate at small angles to deflect the light beam from the light source 166 onto different positions of the substrate surface. In one embodiment, the substrate may be rotated at about 90 degrees. Additional secondary mirrors may be used (not shown) to direct the return light beam 178 on the photodetector 170. The light beam positioner 184 may also be used to scan the light beam in a raster pattern across the backside of the substrate 220. In this embodiment, the light beam positioner 184 comprises a scanning assembly consisting of a movable stage (not shown), upon which the light source 166, the focusing assembly 168 and the detector 170 are mounted. The movable stage can be moved through set intervals by a drive mechanism, such as a stepper motor or galvanometer, to scan the beam spot 180 across the substrate 220.

The photodetector 170 comprises a light-sensitive electronic component, such as a photovoltaic cell, photodiode, or phototransistor, which provides a signal in response to a measured intensity of the return light beam 178. The signal can be in the form of a change in the level of a current passing through an electrical component or a change in a voltage applied across an electrical component. The photodetector 170 can also comprise a spectrometer (array detector with a wavelength-dispersive element) to provide data over a wide wavelength range, such as ultraviolet to visible, from about 200 nm to 800 nm. The return light beam 178 undergoes constructive and/or destructive interference which increases or decreases the intensity of the light beam, and the light detector 170 provides an electrical output signal in relation to the measured intensity of the reflected light beam 178. The electrical output signal is plotted as a function of time to provide a spectrum having numerous waveform patterns corresponding to the varying intensity of the reflected light beam 178.

A computer program on a computer system 172 compares the shape of the measured waveform pattern of the reflected light beam 178 to a stored characteristic (or reference) waveform pattern and determines the endpoint of the etching process when the measured waveform pattern is the same as the characteristic waveform pattern. As such, the period of the interference signal may be used to calculate the depth and etch rate. The program may also operate on the measured waveform to detect a characteristic waveform, such as, an inflection point. The operations can be simple mathematic operations, such as evaluating a moving derivative to detect an inflection point. Although FIG. 1A shows the computer system 172 connected to the endpoint system 164, it is also used for processing data from other endpoint detectors in the system.

FIG. 1A is meant to illustrate the relative positioning of the optical access ports or windows 110 and 112 in the substrate support member 16. A close-up cross-section view of two alternative optical configurations is shown schematically in FIG. 1B. The substrate support member 16 is provided with recessed portions 132 and 134, which are separately connected to openings or channels 136 and 138 to allow optical access to the backside of substrate 220. The recess portions 132 and 134 are provided with O-rings and grooves 142 and 144 for vacuum sealing to windows 124 and 126, respectively. One configuration illustrates endpoint detection based on reflection measurements through window 124, with incident light in a fiber 121 being focused by lens 123 onto the substrate 220. The signal returning from the backside of substrate 220 is then collimated by the lens 123 and coupled via a fiber 125 to the endpoint detection system 164. Different focal lengths may be used for lens 123, and in one embodiment, a focal length of about 15 mm is used. In other embodiments, collimating lens 123 may be omitted, in which case, fibers 121 and 125 can be mounted up against the window 124. Depending on the specific measurements and optical configurations, fibers 121 and 125 may refer to either a single fiber or a fiber bundle (having more than one fiber). The use of multiple fibers offers additional capabilities, including, for example, improved signal strengths and simultaneous sampling of different areas.

Another configuration illustrates endpoint detection based on transmission measurements through window 126. A transmission signal, e.g., plasma emission or external light source, passes through window 126 and is collected by fiber 127 for detection. As shown in FIG. 1B, the opening or channel 138 is provided with a tapered or conical section 140 near the top surface of the substrate support member 16. The conical section 140 has a larger diameter (or lateral dimension) at the top compared to the interior portion, i.e., the portion closer to the recessed portion 134. This design has an advantage of providing a wider field of view or sampling area at the substrate 220, without requiring the use of a larger size window 126. In one embodiment, the conical section 140 is shaped to provide a field of view with a full angle of about 25° for use with a fiber having a numerical aperture of about 0.22. The field of view can also be changed by adjusting the distance between the fiber 127 and the window 126. Optionally, a diverging lens may also be used for coupling the emission to the fiber 127.

The various optical components are mounted and secured inside the substrate support member 16 using a variety of hardware known to one skilled in the art, and have been omitted in FIG. 1B for the sake of clarity. Since the substrate support member 16 is made of a conductive material, e.g., anodized aluminum, the mounting hardware are either non-conducting or otherwise insulated from the substrate support member 16. The size of the openings 136, 138 and recessed portions 132, 134 may vary according to specific design and/or process needs, for example, taking into account factors such as the optical beam spot size, desired sample areas, minimal impact on RF bias, and so on. For example, the recessed portions 132, 134 may have diameters ranging from several millimeters (mm) to several centimeters (cm), while openings 136, 138 may have diameters up to about one centimeter. In one embodiment, an opening with a diameter of about 7 mm is used with a beam spot size of about 2 mm. Other design alternatives may include providing a conductive grid or conductive transparent coating on the windows in order to minimize potential impact on the RF bias to the substrate support member 16.

The endpoint detection system 164 can be configured to detect patterns disposed in any region of the substrate surface. Depending on the specific endpoint detection technique, the patterns on the substrate may be any suitable device features on the photomask, or they may be test patterns with specific feature design or dimension to facilitate endpoint detection. For example, such test patterns may be line/space patterns with a single or varying pitch and/or linewidth.

Figure 1C:
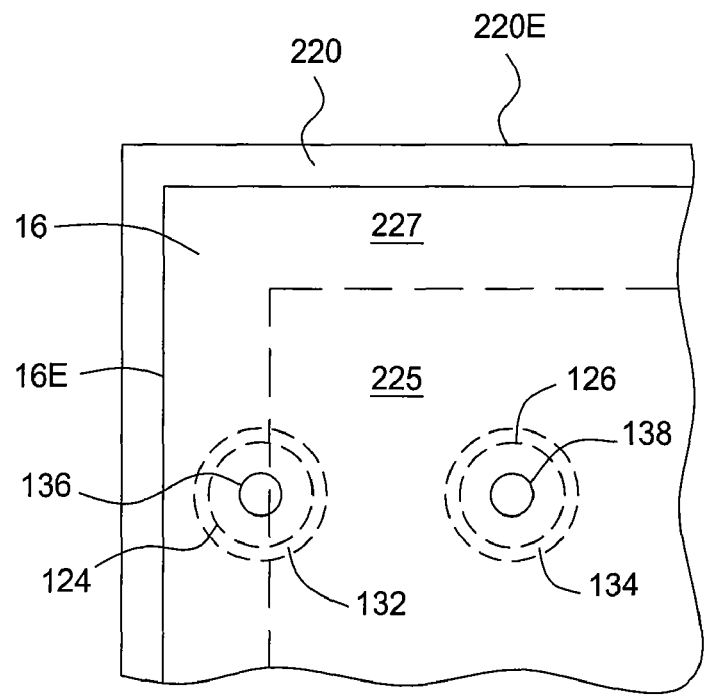
FIG. 1C is a schematic top view of one embodiment for endpoint detection.

FIG. 1C is a schematic top view showing one embodiment of the relative positions of openings 136, 138, windows 124, 126, substrate support member 16 and the substrate 220. The side or edge 220E of the substrate 220 extends beyond the edge 16E of the substrate support member 16. As shown, the separation between the peripheral region 227 and the central region 225 of the substrate 220 is indicated by a dashed line. Opening 138 is used for monitoring endpoint in the central region 225. Although opening 136 covers an area that includes both the peripheral region 227 and the central region 225 of the substrate 220, it can still be used for endpoint monitoring purposes, e.g., to obtain etch uniformity information, among others. Alternatively, if the endpoint monitoring through opening 136 is based on a signal from a specific test pattern provided in the peripheral region 227, such endpoint monitoring can be effectively performed, as long as the detected signal is substantially free from interference that might arise from features in the central region 225 that are within the field of view of opening 136. In general, to avoid undesirable interference, test patterns are provided at locations sufficiently separate from features in the central region 225 of the substrate 220. In one embodiment, one or more test patterns are provided at distances up to about 10 mm from the edge 220E of the substrate 220, and openings are provided at corresponding locations of the substrate support member 16 for endpoint monitoring.

Figure 3:
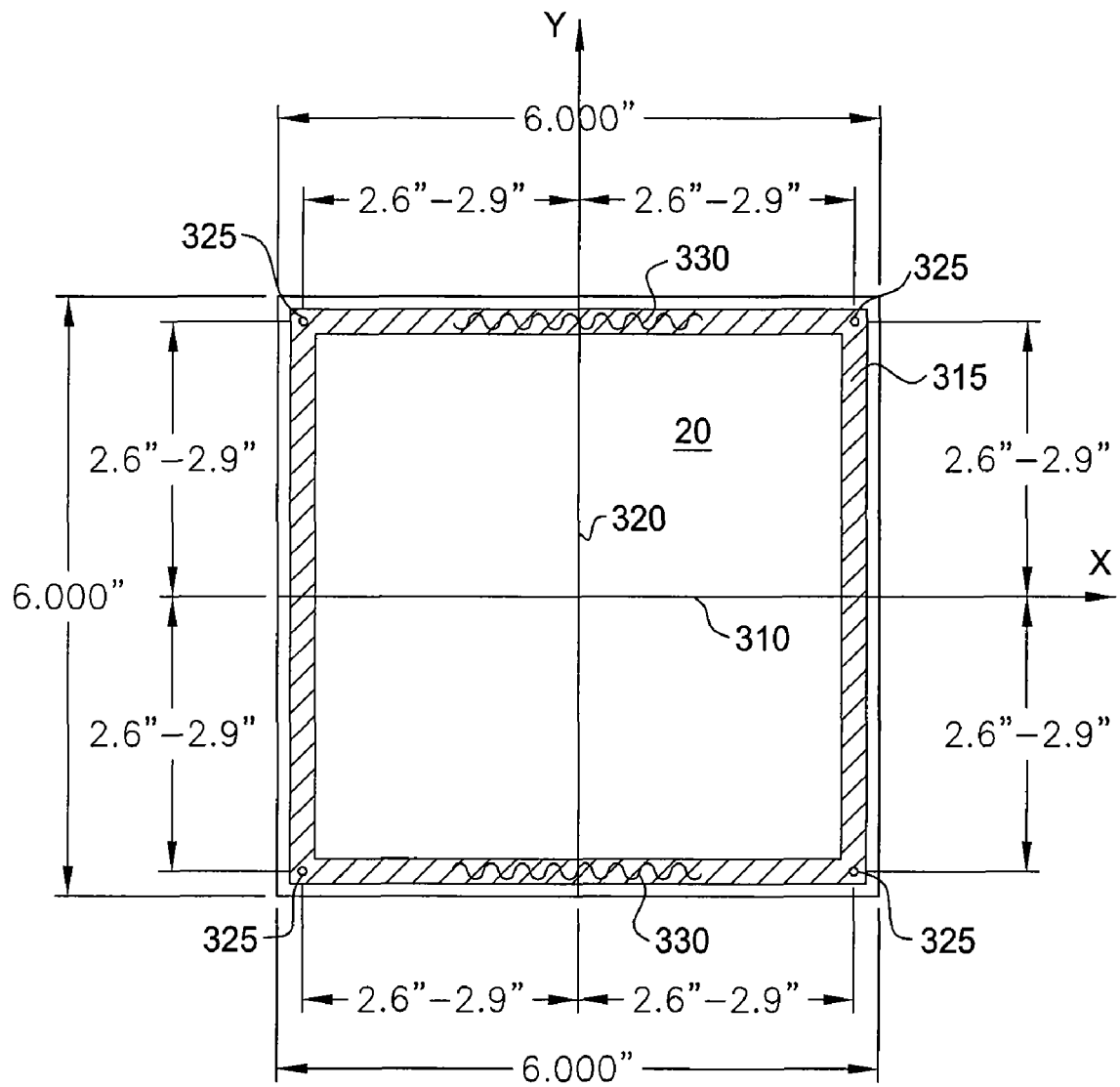
FIG. 3 illustrates a top view of a 6-inch substrate with peripheral locations for endpoint detection.

FIG. 3 illustrates a top view of a 6-inch square substrate with various locations in the peripheral region for endpoint monitoring. In one embodiment, endpoint detection is performed based on the monitoring of one or more test patterns 330 disposed in the peripheral region 315 or at the corners 325 of the substrate, and the endpoint detection system 164 may be disposed directly below these regions of the substrate. For example, with a 6 inch by 6 inch substrate, the windows of the endpoint detection system 164 may be disposed at least about 2.6 inches, such as between about 2.6-2.9 inches, from a horizontal center line 310 of the substrate 220 and at least about 2.6 inches, such as between about 2.6-2.9 inches, from a vertical center line 320 of the substrate 220, as illustrated in FIG. 3. The window 112 is generally located at the intersection of lines 310, 320. Windows 112A are generally located less than 2.6 inches from the center in the plane of the substrate support member 16 for monitoring areas within the central region 225 of the substrate. In one embodiment, the test pattern has a size that is about the same or larger than the beam spot.

The light beams reflected from each substrate having the same test patterns are configured to have the same waveform patterns when detected by the endpoint detection system 164. In this manner, the waveform patterns derived from the same test patterns may be used to determine whether the chamber is operating according to a particular process recipe, and whether the desired etch results are obtained for different substrates.

While test patterns or various dimensions and/or designs can readily be provided in the peripheral region, the placement of such patterns in the central region of the photomask is much more restrictive. Thus, the availability of features for endpoint monitoring in the central region usually depend on the device design and layout on the photomask. If the monitored area does not provide sufficiently strong optical signal for monitoring, e.g., due to insufficient open areas, alternative optical configurations may be used to increase the field of view or to provide multiple sampling areas. Such alternatives may include the use of optical components, e.g., lenses and fibers, with higher numerical apertures (NA), including fibers with tapered ends or the use of fiber bundles to sample different areas. The use of larger NA optics allows the sampling area to be increased without necessarily increasing the size of the window. The use of multiple fibers (e.g., fiber bundle) allows optical signals to be monitored at different areas of the substrate. Depending on the specific features and detection techniques, signals from these different areas, such as different locations across the center region of the substrate, may be added together to provide an improved signal, or the different signals may be compared with each other and the best one selected for use in endpoint detection. In most embodiments, the collection optics is configured to sample optical signals in a direction substantially perpendicular to the plane of the substrate. In another embodiment, the collection optics may also sample signals from an oblique view angle, i.e., not perpendicular to the substrate. This oblique viewing configuration will also result in an increased sampling area compared to the perpendicular configuration using the same collection optics.

In the transmission mode of operation, the endpoint detection system 164 monitors the transmittance (e.g., total light intensity) or optical emission signals (e.g., wavelength-resolved emission) as a function of time. In one embodiment, the plasma in the chamber 10 serves as the light source for the optical emission monitoring. This configuration has the advantage of a simpler optical setup compared to the reflection mode, because it does not require an external light source and only one optical fiber is needed.

The plasma emission typically includes light at discrete wavelengths that are characteristic of various species present in the plasma. For example, emission can be monitored at one or more wavelengths that correspond to one or more etchant/reactant or etch product species. At the etch endpoint, e.g., when a certain material layer is completely etched and an underlying layer is exposed, the monitored emission intensity changes according to whether there is an increase or decrease of the emitting species being monitored. In general, the optical emission detection apparatus 150 of the endpoint detection system 164 comprises light collection assembly 152, a wavelength dispersive element 156 and a photodetector 158. In one embodiment, the light collection assembly 152 includes an optical fiber 153, and optionally, a lens 154 for coupling the optical signal to the fiber 153. The wavelength dispersive element 156 may be a spectrometer for separating the optical signal 178 into its component wavelengths. In other embodiments, the light collection optical assembly 152 may include various bulk optical components such as lenses and mirrors, and the wavelength dispersive element 156 may be a variety of filters to pass a selective range of wavelengths.

Depending on the specific arrangements, the photodetector 158 may be configured to detect optical signals at a specific wavelength, or it may detect the signals at different wavelengths simultaneously. Suitable photodetectors may include a photodiode, photomultiplier tube or a charged-coupled device, among others.

Although the embodiment in FIG. 1A shows different optical signals from windows 110 and 112, e.g., reflection and transmission signals, coupled to different optical components of the endpoint detection system 164, the two signals monitored through windows 110 and 112 may also be the same type of optical signals, e.g., both being reflectance signals or transmittance signals, and so on. In addition, the two optical signals from windows 110 and 112 may be coupled to the same photodetector. For example, if an imaging photodetector is used, a plasma emission signal from one window may be imaged onto a first set of detector elements or pixels of the detector, and the other emission signal from the second window may be imaged onto a second set of detector elements or pixels of the same detector.

Furthermore, even though FIG. 1A shows only windows 110 and 112 as being disposed in the substrate support member 16, while other optical components are shown as external to the substrate support member 16, such depiction is partly illustrative, and partly for the sake of clarity in the figure. It is understood that one or more optical components, e.g., windows, optical fibers, lenses, photodetectors, among others, of the endpoint detection system 164 may also be disposed or embedded in the substrate support member 16, or be integrated with the optical access window 110 or 112. Other combinations of different optical measurements and configurations of signal detection can also be advantageously used for endpoint monitoring at two or more locations of the substrate.

In another embodiment, the use of an external light source 190, in conjunction with or in place of the plasma source, can expand the capabilities or provide advantages for transmittance measurements. For transmission mode, the external light source 190 will be coupled into the chamber 10 through a window 192 provided on the ceiling 13. The use of the external light source 190 for transmittance measurements has an advantage over the plasma source because it can provide a more stable signal than plasma emission, which may be subjected to fluctuations arising from the etch process. The external light source 190 may be configured to allow monitoring at selected wavelengths that are free from potential interferences from the plasma species. Similar to light source 166, the external light source 190 can also be operated in a pulsed mode to allow for various signal processing options for enhancing endpoint detection capabilities, e.g., by subtracting out possible fluctuations from plasma emission, and so on. Details for pulsed source operation with light source 190 are similar to those previously described for source 166. Other embodiments may involve the use of a pulsed source for both reflection and transmission measurements. In another embodiment, the external light source 190 may be provided through an optical access window (not shown) in the substrate support member 16, and the transmission signal monitored through the window 192.

As an example of reflectance monitoring, output from the light source 190 is coupled via a fiber 194 to pass through the window 192 onto the substrate 220 such as a photomask. Reflected light (e.g., off a feature on the photomask) is collected by a collimating lens 196 and coupled into another fiber 197 leading to a broadband spectrometer detector 198. The spectrometer 198 separates the light into its wavelength components, e.g., about 200 nm to 800 mm, to record a first spectrum.

A second spectrum is collected with the pulsed source off. This provides a background spectrum which can then be subtracted from the first spectrum. The difference spectrum, which includes contribution from the reflected light only, and will not be affected by plasma light. This sequence of collecting two spectra is repeated for each data point during the etch process. As a result, any changes in the plasma will not affect the measured reflectance, as might happen if the plasma emission is relatively intense.

Since the substrate (photomask) is a dielectric, e.g., transparent, the reflection measurement setup with background subtraction can be performed from either side of the substrate 220. That is, the fiber bundle and collimating optics can be placed on the ceiling 13 for collecting a signal from the substrate 220 through a ceiling window 192, or they can be placed below the substrate 220 for monitoring from the backside of the substrate.

The latter configuration of endpoint monitoring from below (i.e., through the substrate) offers at least two advantages. First, in the case of an absorbing layer being etched, such as Cr, the optical signal from the backside of the substrate will be less affected by changes in the thickness of the photoresist masking layer when viewed from below the substrate compared to viewing from above the substrate top surface. Second, for certain applications, a small optical sampling area is desired. For example, with quartz etch, interferometry is most accurate when measured within a designated test area with a uniform pattern. Thus, the use of backside monitoring in which the collimating optics are close to the substrate enables a smaller optical beam to be used than one that would originate from the ceiling of the chamber.

This subtraction technique can also be applied to transmission measurements, in which the light source and the detector are on opposite sides of the substrate being processed. This might entail a window in the ceiling and a window in the substrate holder, and separate optics for collection.

Figure 4A:
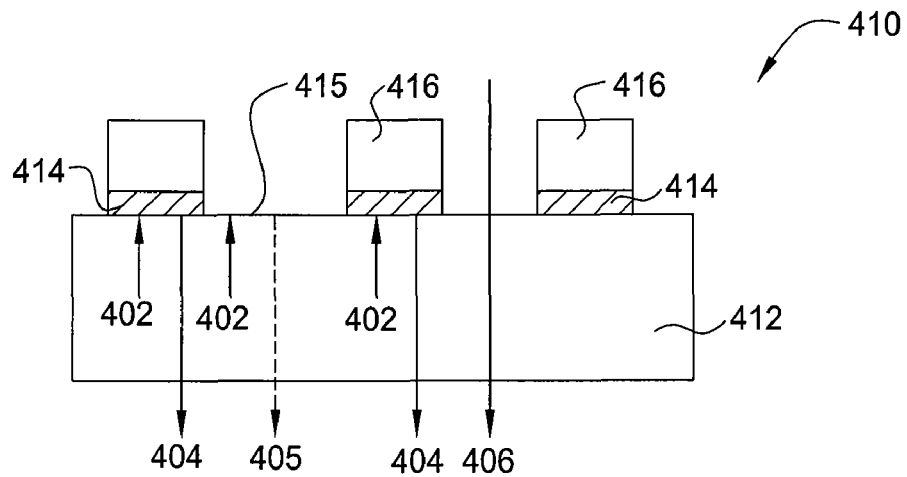
FIGS. 4A-C are illustrate schematically structures of several types of photomasks during fabrication.
Figure 4B:
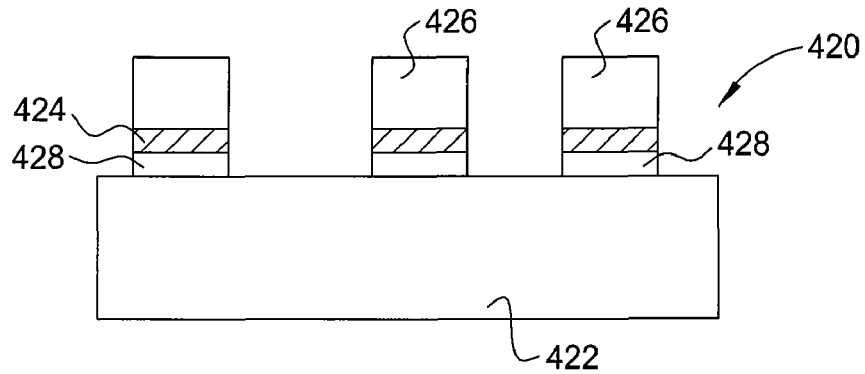
Figure 4C:
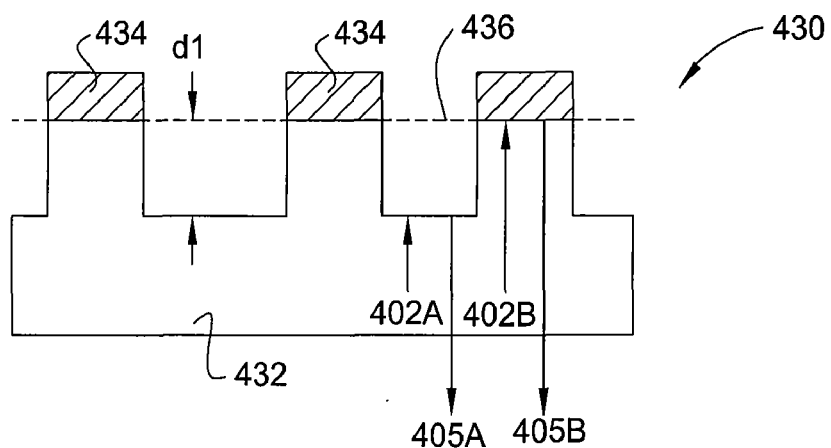

FIGS. 4A-C illustrate various structures during the fabrication of a photomask substrate that may be monitored by different endpoint detection techniques. FIG. 4A shows a binary photomask structure 410 with a patterned photoresist 416 for etching a metal-containing layer 414, e.g., a chrome layer comprising chromium oxide and chromium, which is disposed over a glass or quartz layer 412. The endpoint for etching the chrome layer 414 can be monitored either in reflection or transmission mode, and reflectance, transmittance and/or optical emission measurements can be performed.

For example, an incident optical beam 402 from the endpoint detection system 164 may be directed, through one of the windows in the substrate support member, onto one area of the photomask substrate 410. A return beam 404, arising from the interaction between the incident beam 402 and the photomask structure 410, e.g., reflecting off the back surface of chrome layer 414 (or interface between the chrome layer and the quartz layer), is detected by the photodetector 170 of the endpoint detection system 164. At the etch endpoint for the chrome layer 414, the reflectance signal decreases because the chrome layer in the open areas 415 (where there is no photoresist) of the photomask is removed, resulting in a loss of the reflected beam from these areas, as shown by the dashed arrow 405. Furthermore, diffraction analysis of the reflection spectrum may be performed to estimate the etch profile of a chrome feature, and to terminate the etch process when the foot of the chrome feature is cleared. Such analysis will allow the control of the etch profile of the feature.

In the transmission mode, the optical emission signal, e.g., from the plasma, passing through the open areas 415 is monitored. In one embodiment, the total intensity of the emission, i.e., the transmittance, may be measured. In another embodiment, the emission may be coupled to a wavelength dispersive element and signals monitored at one or more selected wavelengths. Towards the end of the chrome etch when the remaining chrome thickness is relatively small, the chrome thickness can also be estimated from the transmission signal.

FIG. 4B shows another photomask structure 420 during the fabrication of an attenuated phase shift mask. The structure 420 has a phase shifting material layer 428, e.g., molybdenum silicide (MoSi), formed over a quartz layer 422. A chrome layer 424 is deposited on top of the MoSi layer 428, followed by a photoresist layer 426. The photoresist layer 426 is patterned and used as an etch mask for the chrome layer 424. The molybdenum silicide (MoSi) layer can then be etched with either the patterned photoresist layer 426 acting as a mask, or with the patterned chrome layer 424 as a hardmask (after stripping of the photoresist layer 426). Similar to chrome etching, the endpoint for MoSi etching can be monitored in either reflection or transmission mode, and reflectance, transmittance, or optical emission measurement can be performed. Since MoSi is partially transmitting, interferometric measurements can also be used for endpoint monitoring.

FIG. 4C shows another mask structure 430 for fabrication a quartz phase shift mask, with a patterned chrome layer 434 serving as a hard mask for etching the underlying quartz layer 432. The original, or pre-etch, top surface 436 of the quartz substrate 432 is shown as a dashed line in FIG. 4C. In this case, the quartz layer 432 has to be etched down to a certain predetermined depth $d_1$ below the original surface 436. By operating the endpoint detection system 164 in reflection mode, the return beam 178 at a particular wavelength can be monitored as a function of time to provide interferometric data, e.g., the appearance of fringes arising from optical interference between different portions of the reflected beam 178 that travel through different thicknesses of a material layer. For example, one portion 402A of an incident optical beam is reflected off an open area of the photomask 430, while another portion 402B of the incident optical beam is reflected off a masked area of the photomask 430, e.g., an area with a chrome layer/feature 434. Interferences between the two reflected portions 405A and 405B produce interference fringes (i.e., intensity modulations) that are indicative of the difference in quartz layer thickness traversed by these portions 405A, 405B. By monitoring the interference fringes in the reflected beam, the etch depth $d_1$ can be obtained. In one embodiment, interferometric endpoint monitoring is performed in a pulsed mode, as previously described in connection with light source 166 in FIG. 1A. In general, any narrow band source may be suitable for interferometric monitoring. Thus, it is also possible to use the plasma as a light source for interferometric monitoring, as long as the plasma emission has a sufficiently narrow bandwidth for this purpose.

Figure 5:
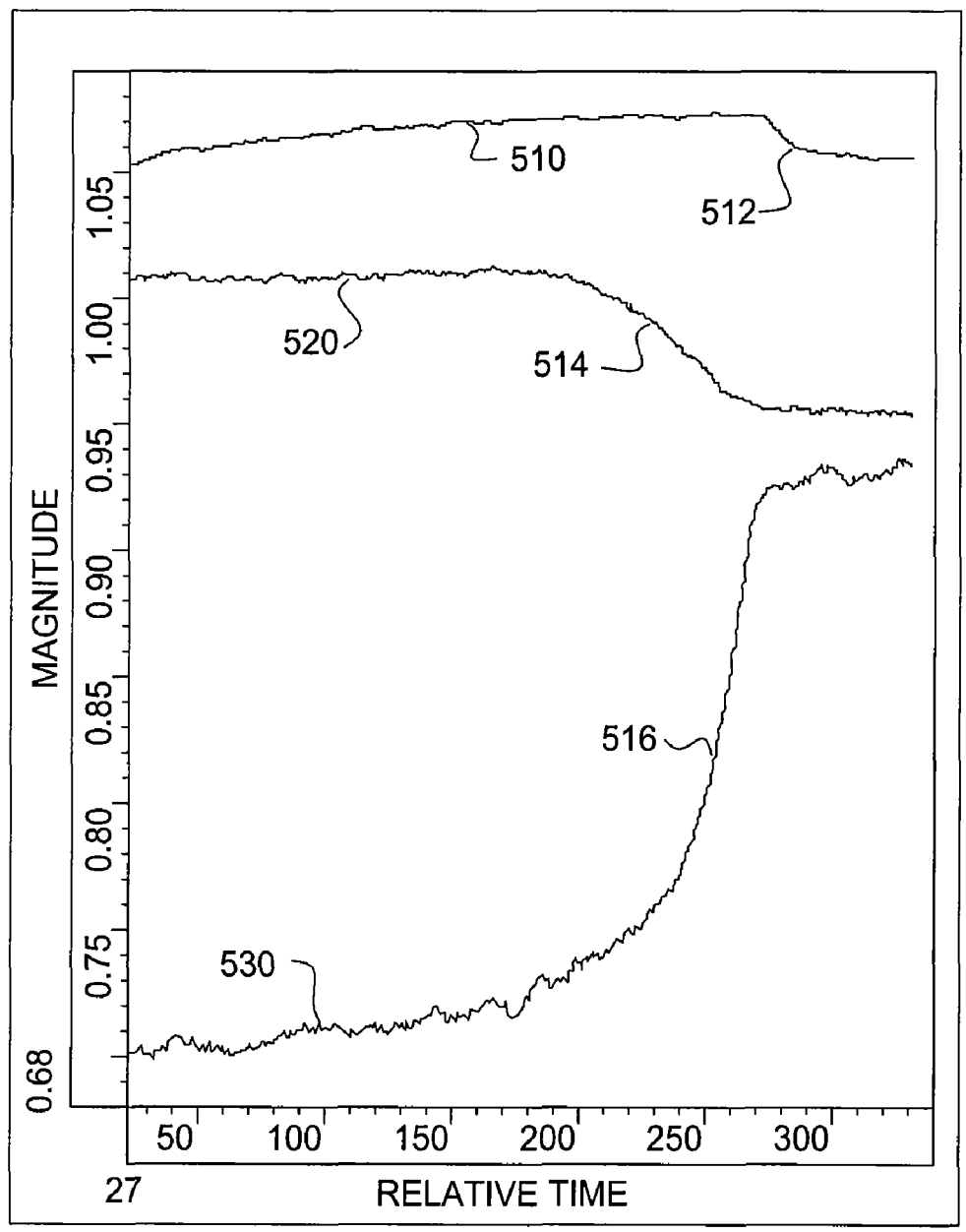
FIG. 5 is an illustration of various optical signals used for endpoint detection.

FIG. 5 shows three optical signals monitored simultaneously as a function of time during the etching of a Cr mask using the endpoint detection system. The chrome layer is etched using a plasma containing chlorine and oxygen gases. The top trace 510 is obtained by monitoring an emission signal originating from Cr, for example, either by directly monitoring an atomic line from Cr e.g., at a wavelength of 520 nm, or by monitoring the Cr emission line and a chlorine line (e.g., 258 nm) and taking a ratio of the Cr:Cl emission signals. Typically, the signal to noise can be improved by taking a ratio of emission signals of etch products to reactants (or vice versa). As the chrome etch approaches endpoint, the concentration of chromium-containing species (etch products) in the plasma decreases, resulting in a corresponding change in the Cr emission signal (or Cr:Cl emission ratio), as shown at point 512 of the top trace 510. In general, the optical emission signal can be monitored through one or more windows in chamber 10, e.g., those provided in the substrate support member 16 or in the ceiling, by looking directly at the plasma. In addition, a side window 193 may be provided in the chamber wall for detecting the plasma emission, for example, by coupling the emission to an optical emission detector system 195, as shown in FIG. 1A. The emission monitoring through the sidewall window 193 may be performed in conjunction with endpoint monitoring through one or more other windows.

The middle trace 520 is obtained by monitoring a reflection signal originating from light reflecting off the bottom surface of the chrome layer, similar to that shown in FIG. 4A. At the chrome etch approaches endpoint, the chrome layer in the open areas 415 of the mask becomes thinner as the chrome is etched away, which results in a decrease in the monitored reflectance signal intensity, as shown in the portion 514.

The bottom trace 530 is obtained by monitoring the transmittance. As shown in portion 516, the transmittance signal intensity increases towards endpoint when the chrome layer in the open areas 415 of the mask is removed, allowing the emission to be transmitted through the quartz layer in these areas.

The use of these optical measurement techniques, coupled with monitoring at two or more locations of the substrate, allows improved process control by providing enhanced endpoint detection. In one embodiment, the endpoint detection system is configured to operate in both the reflection and transmission modes. For example, referring back to FIG. 1A, a transmission signal (e.g., transmittance or plasma emission) is detected through window 112 for monitoring an area in the central region of the substrate, and a reflection signal (e.g., reflectance or interferometric) is detected through window 110 for monitoring an area in the peripheral region of the substrate. Monitoring the central region of the substrate in the transmission mode is advantageous because the alignment requirement between the etched features and the access window is less stringent than the reflection mode, and furthermore, a larger area can be monitored.

Figure 6:
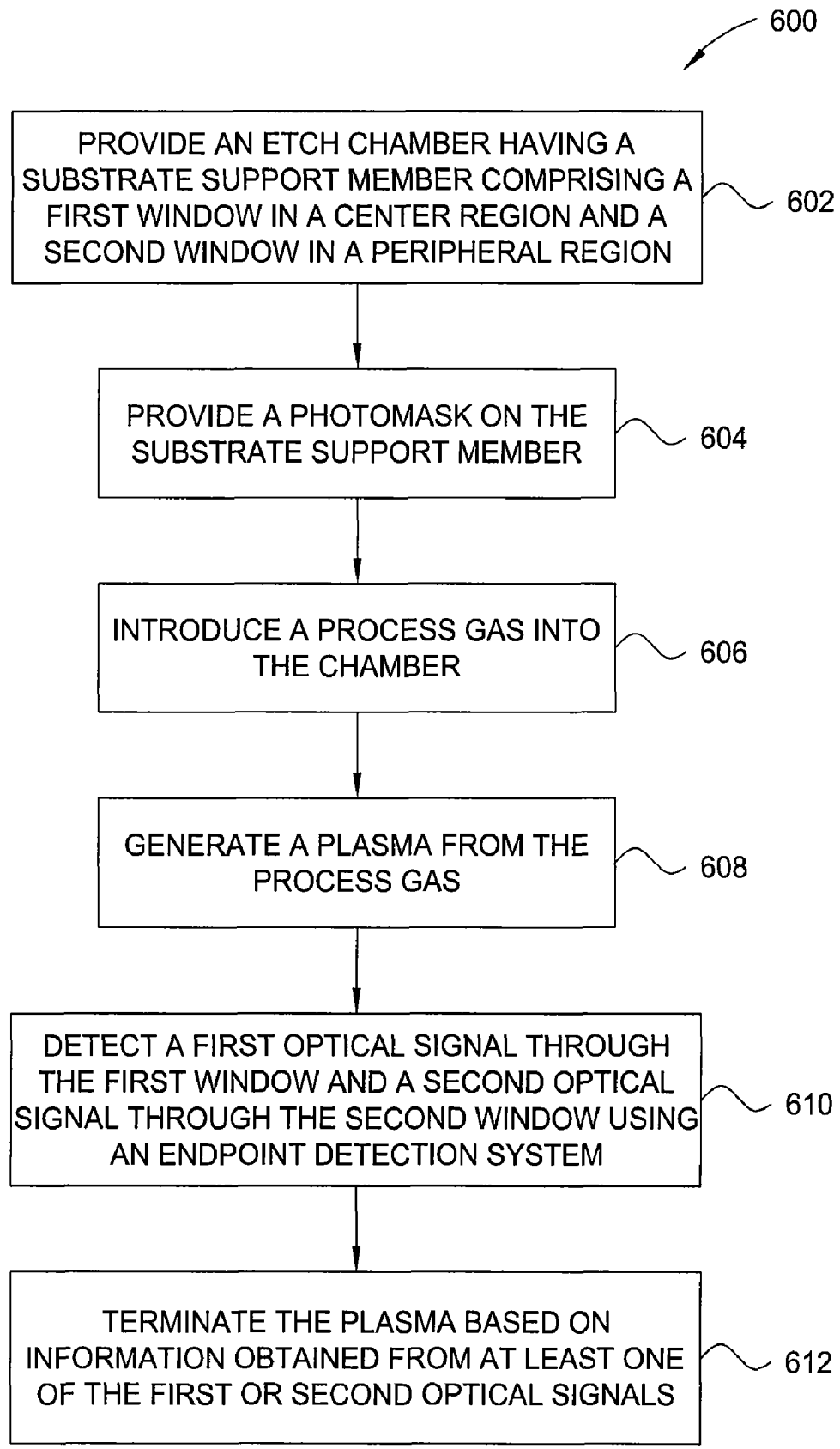
FIG. 6 is a flow diagram of one embodiment of a process for etching a photomask.

Thus, one embodiment of the present invention provides a method that can be implemented using the apparatus of this invention. In one embodiment, the apparatus of this invention includes a computer readable medium containing instructions, that when executed by the controller, such as the computer 172 or other processor suitable for controlling an etch reactor as commonly known in the art, cause an etch chamber to perform a method such as that shown in FIG. 6. It is contemplated that the computer readable medium may be stored in the memory of the computer 172, which also includes support circuits and processor. The method 600 starts at a step 602 where an etch chamber is provided with a substrate support member having a first window and a second window disposed respectively in a center region and a peripheral region of the support member. A photomask is provided on the support member in step 604, and a process gas is introduced into the chamber in step 606. Halogen-containing gases are typically used for etching different materials found on a photomask structure. For example, a process gas containing chlorine may be used for etching a chrome layer, while a fluorine-containing gas such as trifluoromethane ($CHF_3$) or tetrafluoromethane ($CF_4$) may be used for etching quartz. In step 608, a plasma is generated from the process gas, and in step 610, a first and second optical signals are detected through the first and second windows, respectively. In step 612, the plasma in the chamber is terminated based on information obtained from at least one of the two detected optical signals. Furthermore, based on the etch profile results such as center to edge uniformity, process parameters such as etchant gas composition, flow rate, coil bias, and so on, can be adjusted for optimization of the process.

By applying one or more optical measurement techniques for simultaneous monitoring at different locations of the substrate, embodiments of the present invention provide an improved apparatus and method with enhanced process monitoring and control capabilities. These improvements also allow reliable endpoint detection for photomask etching applications with low open areas. For example, optical emission endpoint detection has been demonstrated for etching photomasks with open areas down to about 3 percent for chrome and about 1 percent for molybdenum silicide, and reflectometry has been demonstrated for low open area chrome and quartz etching for phase shift mask applications. Aside from providing information for center to edge etch uniformity, etch rate variations arising from areas with different pattern densities can also be obtained by monitoring multiple optical signals using the endpoint detection system of the present invention. For example, test patterns with different feature size or pattern densities can be provided in different areas of the peripheral region of a photomask and the monitored optical signals can be used for assessing or determining the proper etch endpoint for pattern densities of interest.

It is also contemplated that a single window may be utilized in the substrate support to provide substrate monitoring. Particularly, features described above may be utilized with a single window to enhance substrate monitoring over conventional systems having a single window endpoint detector.

In another embodiment of the invention, an etch process monitoring system is provided with a direct way to view plasma (e.g., side window) and direct way to view etching through the workpiece at one or more locations in the cathode (e.g., cathode windows under the photomask or wafer). Different combinations of these signals for process control can be used. In one embodiment, the etch process monitoring system includes cathodes with 3 or 4 windows, with 2 or 3 windows in the peripheral region of the etching area, a CCD endpoint system configured to simultaneously collect 2 channels of information—one side OES (optical emission spectroscopy), and one "bottom" (through the photomask). The side oes signal is indicative of the state of etching averaged over a large area of the mask, as the entire upper surface of the mask is exposed to the plasma. The "bottom" fiber-optic cable can be placed under any of the 3 or 4 windows in the cathode. Typically this installation is static and the fiber optic cable is fixed in either the center or one of the edge locations. The bottom fiber cable is kept electrically insulating to not transmit bias RF energy to the endpoint system.

The side OES signal arises from a large area of the mask, while the bottom signal arises from a localized area under the mask determined by the optical configuration. Typically this region is of the order of 2-5 mm, but could be changed by altering the design.

The bottom signal can be reflection (by using a light source, called interferometric endpoint "IEP") or transmission (plasma as the light source, called transmission endpoint "TEP"). Although a light source and associated fiber cable may be used, alternatively transmission mode (TEP) may be used which utilizes light provided by the plasma signals detected through the photomask.

Examples and Benefits Include:
1. Confirmation of reaching both OES endpoint and bottom endpoint for greater reliability, especially for low-open area etch applications. For example, OES and bottom endpoint may be used to detect process drift and/or inaccuracies in one of the endpoint methods.
2. Process uniformity evaluation and monitoring to center-fast or center-slow etch conditions by comparing endpoint times for the TEP center and OES (average).
3. Similarly comparing an edge or corner endpoint time to OES to determine left-right or top-bottom etch rate pattern differences.
4. Normalizing the TEP signal through the mask by dividing the TEP signal by the OES signal.
  4a. This normalization provides for a true transmission measurement, largely independent of plasma brightness and fluctuations.
  4b. The normalization also allows for a comparison between the measured spectral transmission of the mask and a real-time model for the transmission, thereby allowing determination of the etching layer thickness (e.g., Cr layer) during etch.
  4c. The normalization also allows for a comparison between the measured spectral transmission of the mask and a real-time model for the transmission, thereby allowing determination of the masking layer thickness (e.g., photoresist) during etch.
  4d. Determination of etch selectivity by dividing Cr etch rate (4b) by the PR etch rate (4a).
  4e. For other applications such as MoSi etch, the MoSi etch rate can also determined in a similar fashion.

Note that all the transmission and/or reflection embodiments described in above can be utilized herein with reference to comparing to a direct view OES signal. It should also be noted that embodiments described herein may be useful for endpoint monitoring in photomask deposition applications, MEMS through-wafer etching, infrared monitoring/process control of either deposition or etching of silicon wafers and infrared band-edge wafer temperature measurements.

In another embodiment, improved etch process control is facilitated by monitoring real-time transmission of the film on the photomask being etched. The absorbing layer (e.g., Cr) has a small but measurable transmittance at the start of etching (typically 1% to 15%, depending on the film type), that increases in a predictable way as the film gets thinner during etching until it is gone completely (100% transmission) at the etch endpoint. A single optical fiber bundle is placed beneath a window under the photomask to collect the increasing plasma light. Typically, the viewing region is of the order of 2-5 mm, which could be changed by altering the design. This configuration may be referred to as "transmission endpoint" (TEP).

Benefits of TEP include endpoint based on actual optical clearing of absorbing film being etched. Provided the location of the window is under an area of film being etched, endpoint may have better reliability than OES, especially for low-open area etch applications. The endpoint system can utilize plasma as a light source, obviating the need for an external light source. With plasma light source, a wide field of view can be used, thereby minimizing the size of the opening in the cathode. The embodiment can be as simple as placing an optical fiber near the cathode window, without any additional optics.

TEP may be advantageously used for chromium and other etch applications. Such applications may include an optic fiber positioned under the photomask to detect an increase of plasma light passing through the chromium layer as it is etched. A light source may also be used to monitor reflection, although the single change is somewhat smaller than the TEP signal, and as such, TEP provides better resolution during chromium applications.

TEP may also be utilized in quartz etch applications. In such applications, optical interferometry may be used. Transmission interferometry can be used to monitor the etch rate and endpoint. The plasma is used as a light source so no lamp is required. The endpoint transmission may be normalized, as discussed above, by dividing the TEP signal by the OES signal obtained through a side window formed in the chamber to reduce signal enhances caused by changes in the plasma. In applications wherein the plasma is sufficiently stable as to provide a steady light source, no background subtraction is required. Reflection interferometry may also be utilized for quartz etching which requires a light source. The light source may be a steady lamp, for example, in the UV region or brighter than the plasma background. Examples of such suitable light sources include deuterium lamp, a high intensity discharge lamp (HID), an arc lamp and a solid state UV LED lamp. The light source may also be switched on and off so that the contribution to the signal from the plasma background may be subtracted from the signal, thereby providing a more accurate signal indicative of the endpoint.

Additionally, still larger areas of the photomask can be sampled. For lamp configurations, collimation optics may be used. For plasma as the light source, a simple field-of-view cone in the cathode may be used, or diverging lenses added. For either lamp configurations, a scanning detector may also be used. If the optical window in the cathode is large, a metallic grid may be placed over the window or a transparent conductive film (e.g., ITO or ZnO) can be used to maintain the RF bias needed for processing the substrate.

Figure 8:
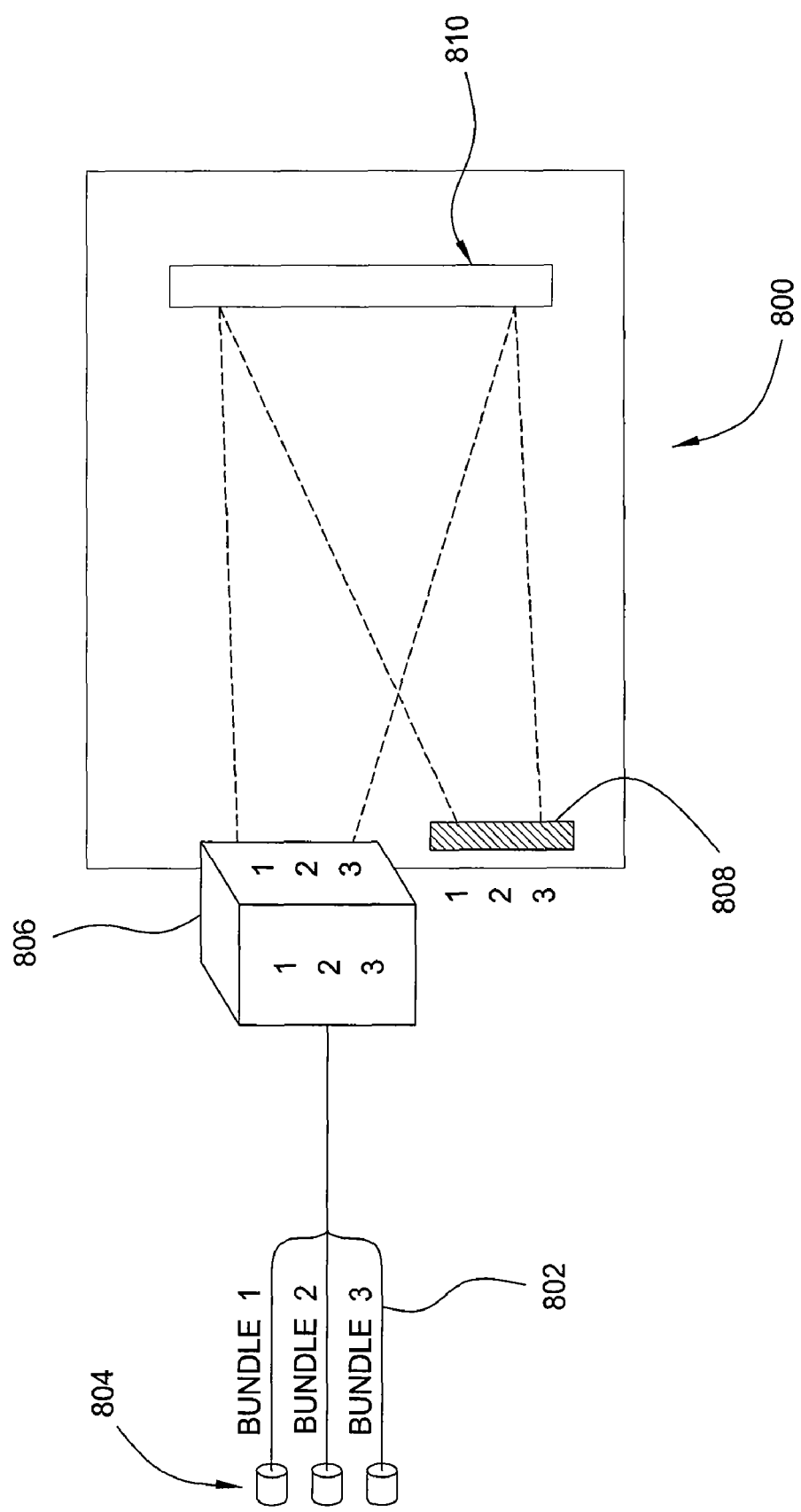
FIG. 8 is a schematic diagram of one embodiment of an exemplary detector.

In one embodiment, an exemplary detector is illustrated in FIG. 8. The detector can be a single wavelength detector, such as a photodiode PMT with filter or monochromator. Each window in the substrate support may be coupled to a separate detector by a fiber optic cable. The detector may also be a multi-wavelength detector such as a spectrometer. The spectrometer may be imaging so that individual portions of the fiber bundle can be treated as separate spectrometers. More than one spectrometer may be used to accommodate simultaneous multiple data collections from different locations.

In an exemplary embodiment depicted in FIG. 8, a photo detector 800 is shown interfaced with a plurality of windows 804 positioned in the substrate support below a reticle (not shown) by a fiber optic bundle 802. The signals (reflective and/or transmissive) from each window 804 enter the photo detector 800 through a port 806. The signals in the photo detector 800 are interacted with a wavelength-dispersive element 810, such as a grating or prism, prior to interacting with a spectrometer 808. The signals from each fiber bundle 802 may be provided to a single spectrometer 808, or the signal from each window 804 may be analyzed separately, by sequentially providing the signals to a single spectrometer, or by providing each signals to a separate spectrometer.

A specific implementation may includes cathodes with 3 or 4 windows, with 2 or 3 windows in the peripheral region of the etching area, one in the center, a CCD endpoint system configured to simultaneously collect 2 channels of information—one side OES (optical emission spectroscopy), and one "bottom" (through the mask). The "bottom" fiber-optic cable can be placed under any of the 3 or 4 windows in the cathode. This installation is static and the fiber optic cable is fixed in either the center or one of the edge locations. The bottom fiber cable is kept electrically insulating to not transmit bias RF energy to the endpoint system. These embodiments may be useful for photomask deposition applications, other substrate (e.g., wafer) etch applications, MEMS through-wafer etching, infrared monitoring/process control of either deposition or etching of silicon wafers and infrared band-edge wafer temperature measurements.

One example of such a configuration is illustrated in FIGS. 9-10. FIG. 9 is a schematic diagram of an etch reactor 900 suitable for etching a photomask reticle 902. The etch reactor 900 is coupled to an endpoint detection system 904 which monitors etching of the reticle 902 through windows disposed through the substrate support 906. The substrate support 906 of the etch reactor 900 is coupled to an RF generator 910 through an RF probe 908. The RF probe 908 is coupled to a controller 912 configured with process state monitoring software that actively controls the etch process performed in the etch reactor 900.

The substrate support 906 includes a plurality of windows through which signals indicative of etch rate and/or endpoint are provided to the endpoint detection system 904. FIG. 10 depicts a top view of the substrate support 906 illustrating the distribution of a center window 1002 and edge windows 1004 formed in the top of the substrate support 906 within the area covered by the reticle 902 during processing. Corner windows and/or windows in other locations are contemplated. In the embodiment depicted in FIG. 10, the edge 1004 windows are positioned below the peripheral area of the reticle 902 as described above.

Referring back to FIG. 9, optical fibers 912 are positioned below each window so that endpoint signals (transmissive and/or reflective) may be provided to the detection system 902. An optical fiber 914 is positioned to view the plasma through a window formed through the side of the etch chamber 900 to provide OES information to the detection system 904. In the embodiment depicted in FIG. 9 the fiber 914 is coupled to a first detector 916, such as a spectrometer, while the fibers 914 are coupled to at least one second detector 918. The second detector 918 may be configured as described with reference to FIG. 8 or other suitable manner. A lamp 920 may optionally be provided to provide reflective signals. The signals may be analyzed by a dedicated endpoint processor 922, such as a PLC or other processor. The endpoint controller 922 is in communication with the controller 912 configured with the process state monitoring software to provide real time etching and/or endpoint information. Optionally, at least one of the controllers 932 or processor 922 is coupled to a front end server 924 and/or host controller 926 to allow integrated metrology information sharing between the production and other tools within the facility. The detector 920 may be configured to have up to three inputs. Additionally, the detectors may be synchronized to all data to be viewed as taken from a single detector.

Figure 11:
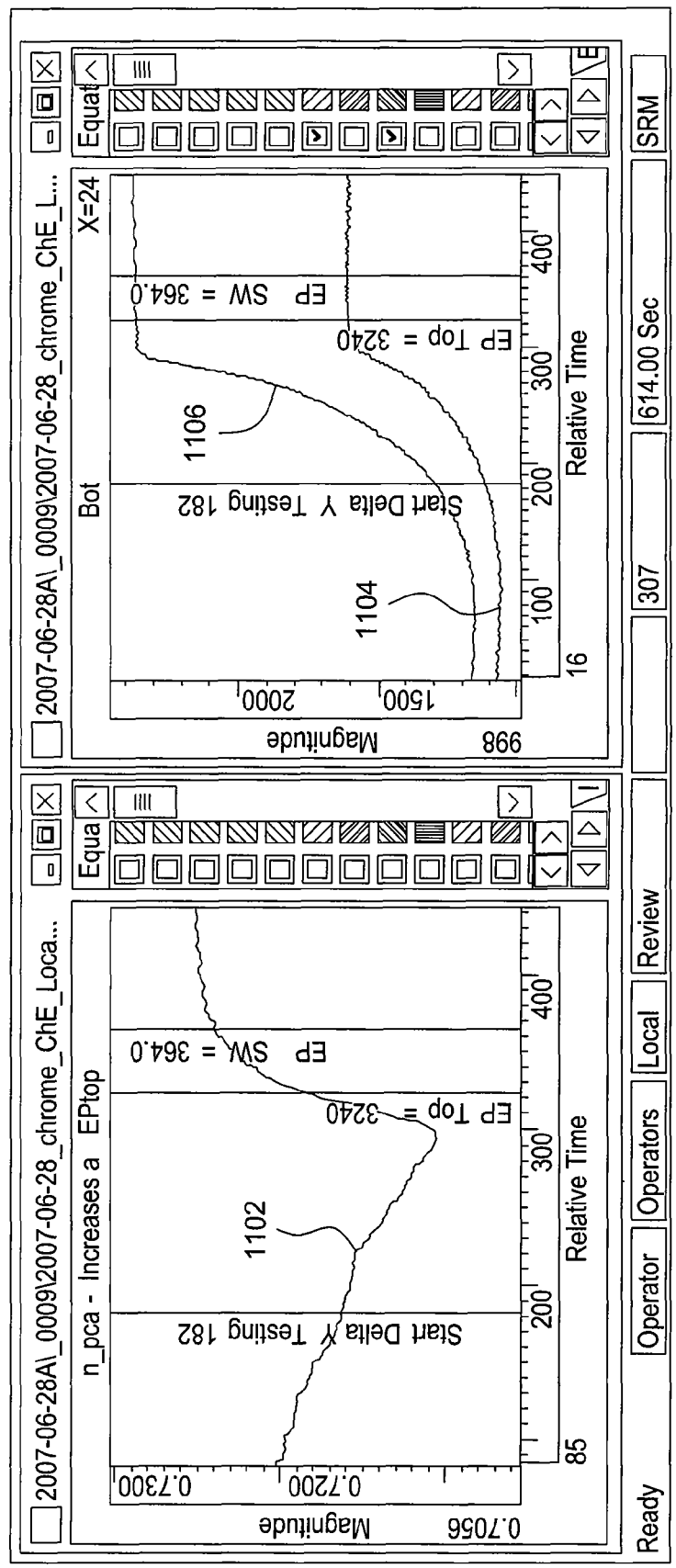
FIG. 11 is graphs of average (side OES) endpoint, left endpoint and top endpoint for one embodiment of a photomask etching process.

FIG. 11 depicts graphs of average (side OES) endpoint, left endpoint and top endpoint. Trace 1102 depicts the average endpoint, while traces 1104 and 1106 depict the endpoint signals respectively obtained at the left and top windows. The traces 1104 and 1106 illustrate a slight lag in the endpoint of the top location, while the trace 1102 illustrates the average endpoint taken using side OES.

Figure 12:
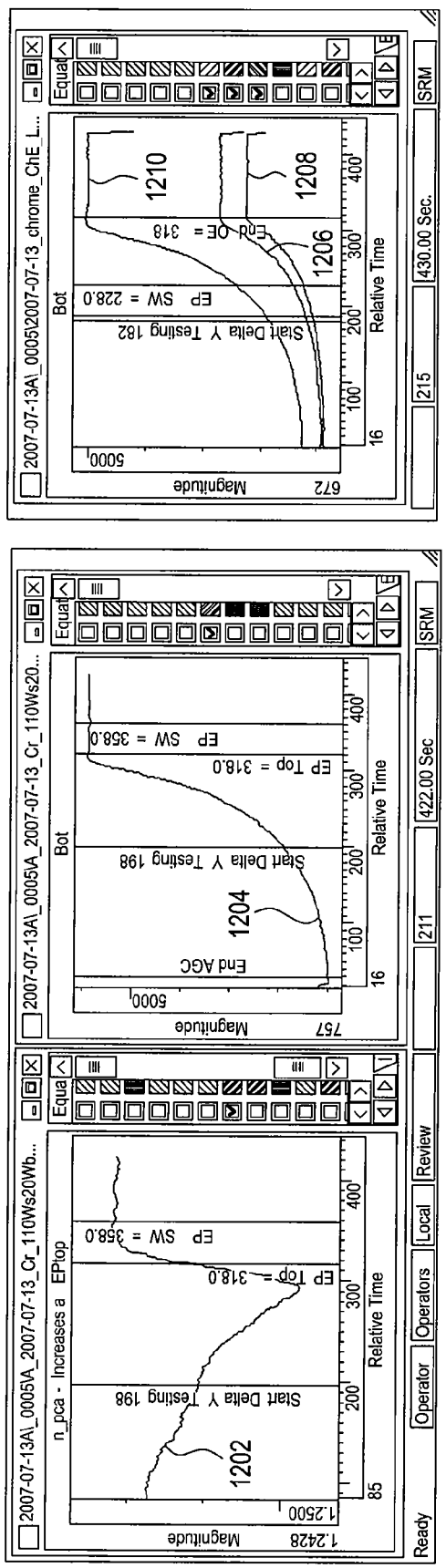
FIG. 12 is a graph of endpoint data taken using side OES, center, left, top and upper right corner during one embodiment of a photomask reticle etching process.

FIG. 12 is illustrative of the ability of two spectrometers to provide information suitable for monitoring process uniformity. FIG. 12 depicts a first trace 1202 representing the average endpoint taken using side OES. A second trace 1204 represents the time to etch in the center of the photomask reticle. The third and fourth traces 1206, 1208 represent the time to etch in the left edge and top edge of the photomask reticle. A fifth trace 1210 represents the time to etch in the corner of the photomask reticle and is shown with the edge traces 1206, 1208. As shown, the endpoint signals may be utilized to determine which area is etching faster and/or clears faster than another area. Such information is useful for adjusting the etch process recipe for the next substrate, or proving such information for adjusting processes performed on the substrate from which the endpoint data was obtained to better control and/or correct the process results.

Figure 13:
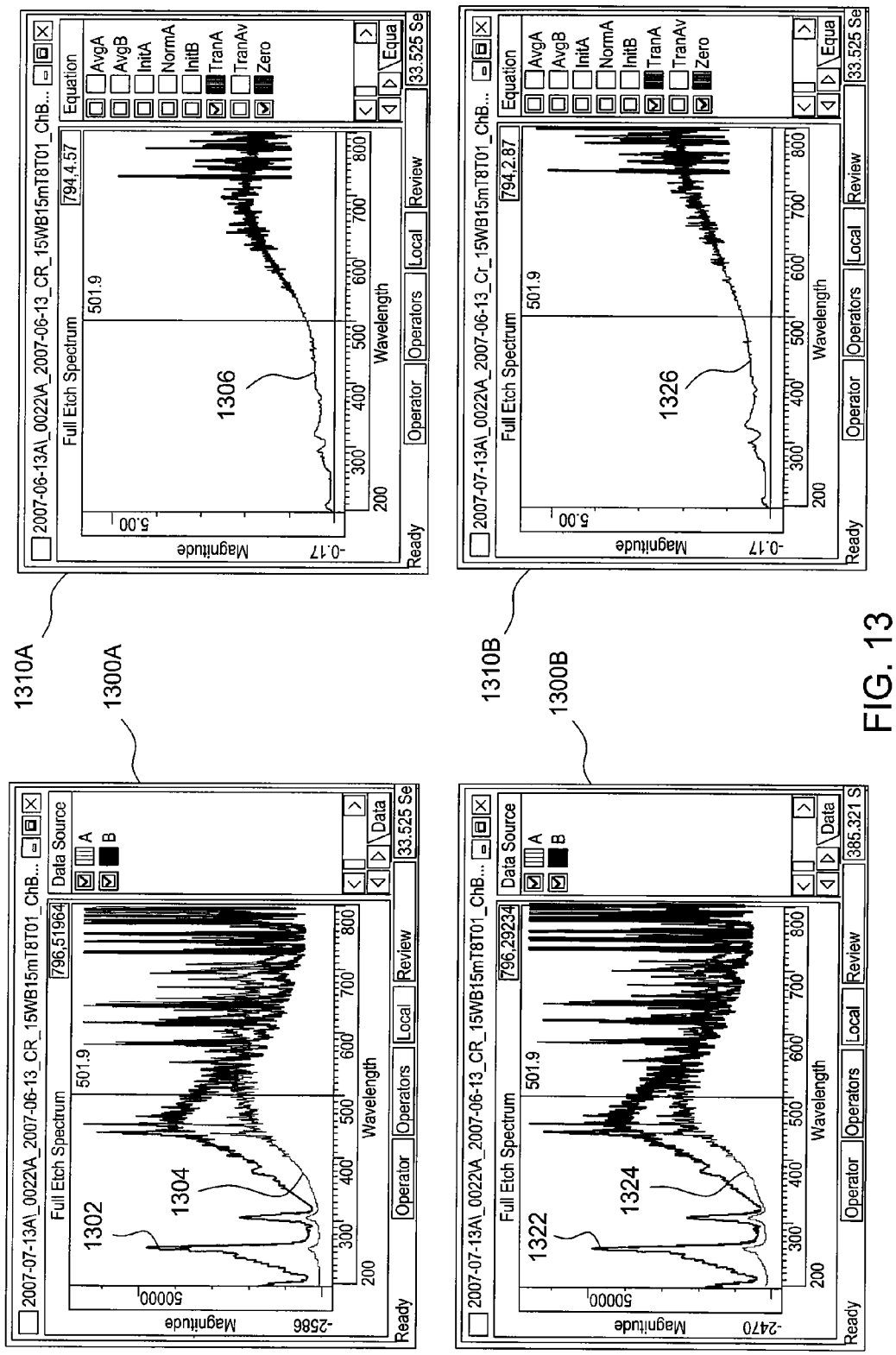
FIG. 13 is a graph of endpoint data taken through the mask and side OES (and resultant transmission) obtained during two periods of the same photomask reticle etching process.
Figure 14:
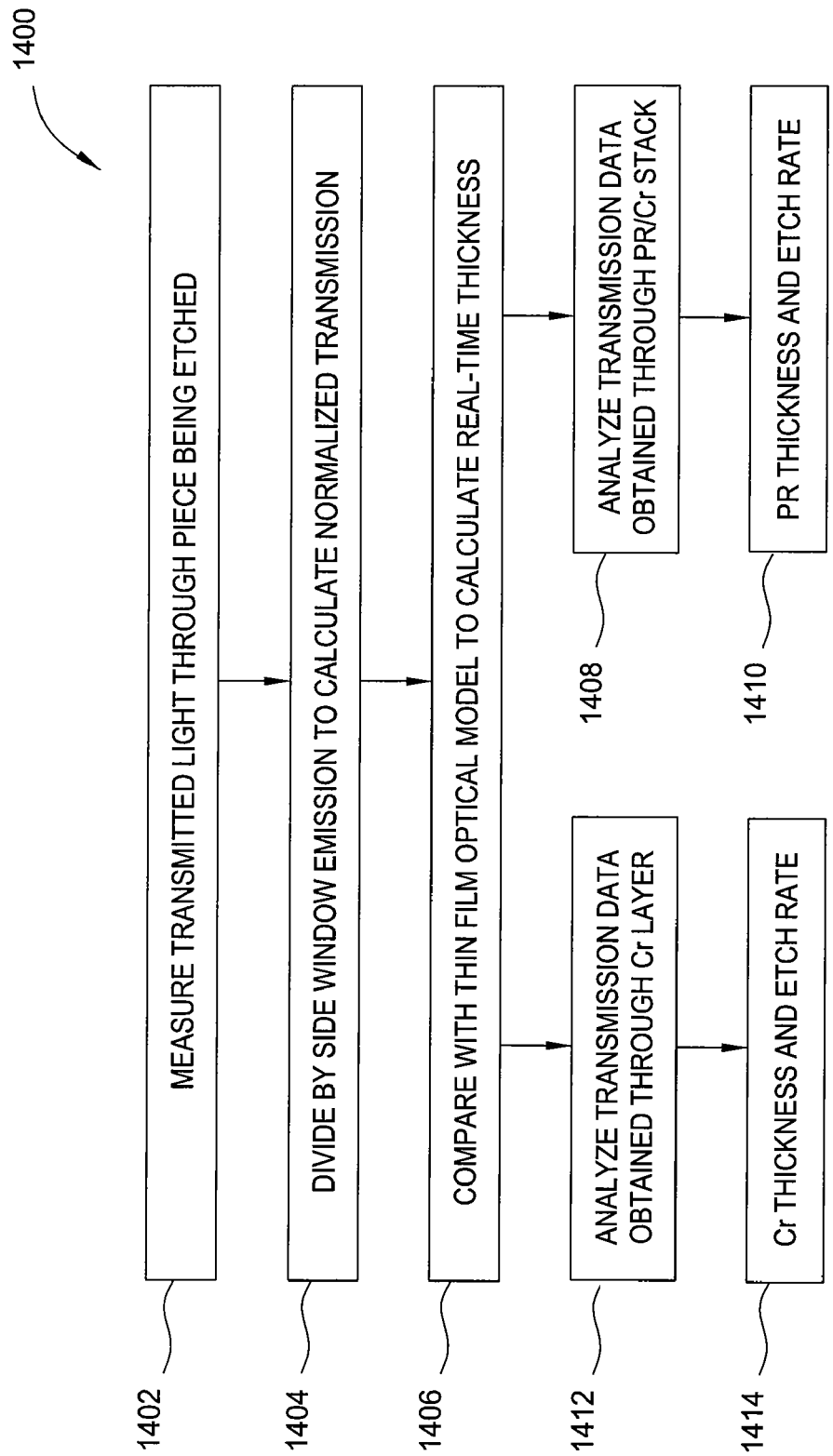
FIG. 14 is a flow chart of one embodiment of a method for monitoring an etch process using normalized transmission endpoint information.

FIG. 13 depicts endpoint signal data obtained from two periods for the same etching cycles. Graph 1300A depicts a trace 1302 of an OES signal obtained through the photomask and a trace 1304 of an OES chamber signal obtained through the window disposed in the side of the chamber. By normalizing the data, e.g., dividing the OES through mask signal by the OES chamber signal, a trace 1306 of the normalized endpoint signal is generated. The data obtained in graphs 1300A and 1310A are obtained after thirty seconds of etching. The data shown in graphs 1300B and 1310B include data taken after 380 seconds of etching. Again, graph 1300B includes a trace 1322 of an OES signal taken through the mask and a trace 1324 of an OES chamber signal. The normalized signal is shown in FIG. 1310B by trace 1326. FIG. 14 depicts a flow chart of a method 1400 for monitoring an etch process using normalized transmission, such as described with reference to FIG. 13. The method 1400 for monitoring an etch process may use a normalized transmission spectrum to measure the chromium thickness and/or resist thickness from an optical thin film model. The process 400 provides information relating to two separate areas, chromium etch rate and photoresist etch rate. The chromium layer generally absorbs the light when having greater than a predetermined thickness. The transmission of light through the chromium layer increases rapidly as the thickness becomes less than about 20 nanometers. The change in transmission is nearly flat after the chromium clears. The photoresist is largely transparent and shows thin film interference. The method 1400 begins at block 1402. The process begins at block 1402 wherein light transmitted through a workpiece being etched (e.g., a photomask reticle) is measured by a detector. At block 1404, the transmitted signal is divided by the emission signal taken through the side window to calculate a normalized transmission. At block 1406, the normalized transmission is compared with a thin film optical model to calculate real time thickness. The information obtained at block 1406 may be utilized to analyze at least one of the chromium and/or photoresist thickness and/or etch rate. At block 1408, the transmission data obtained through the photoresist/chromium stack is analyzed. At block 1410, the photoresist thickness in etch rate is determined using the data analyzed at block 1408. Alternatively, or in addition to the photoresist analysis performed at blocks 1408, 1410, the chromium layer may be analyzed at blocks 1412 and 1414. At block 1412, the transmission data obtained through the chromium layer is analyzed. At block 1414, chromium thickness and/or etch rate is determined through the data analyzed at block 1412. This method can also be applied to etching other materials such as MoSi to determine a MoSi thickness and/or etch rate.

In addition to the embodiments described above, a method of making endpoint detection more reliable is also provided. In one embodiment, the reliability of endpoint detection may be improved by eliminating thin film interference from the photoresist masking layer. For example, optical monitoring of etching may be confounded by the signal rising from etching of the mask rather than of the layer being etched.

Figure 15:
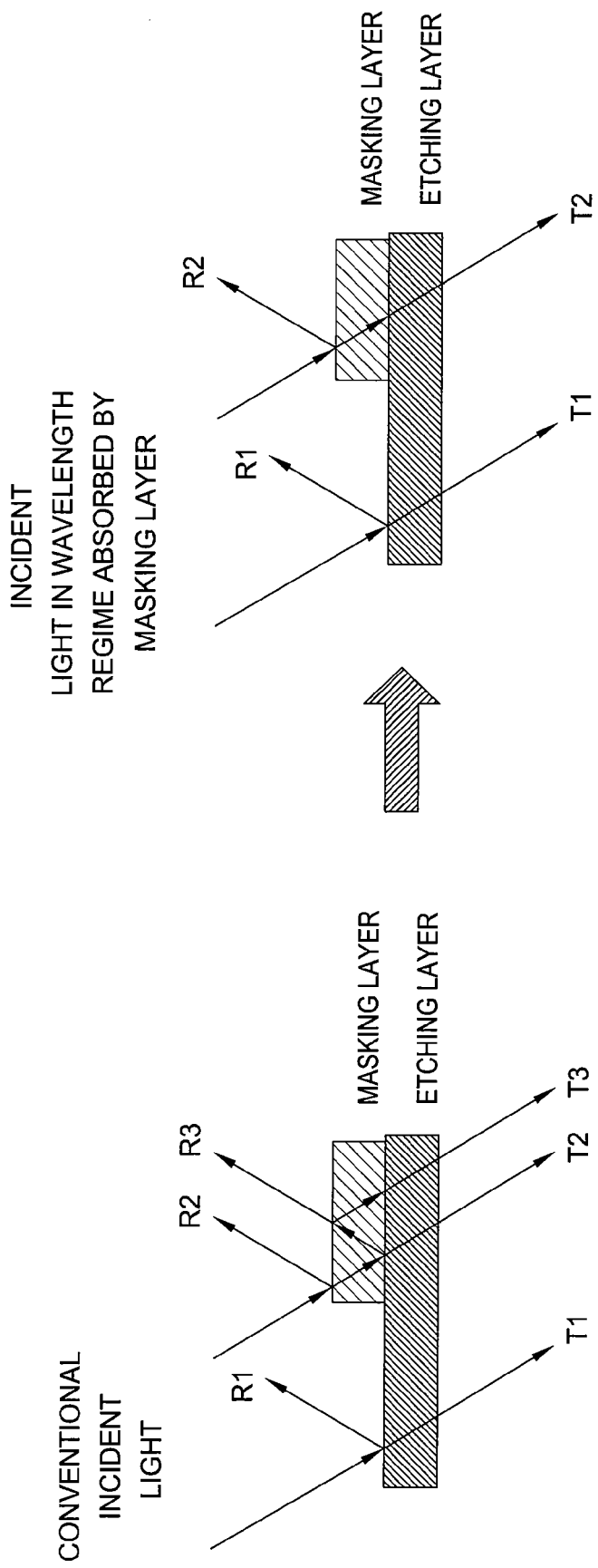
FIGS. 15-16 are schematic diagrams illustrating thin film interference occurring between the top and bottom of a masking layer for light in which the film is substantially transparent, and the absence of interference when the light is substantially absorbed.

Referring to FIG. 15, thin film interference occurs between the top and bottom of the masking layer, specifically by components R2 and R3 for reflection and T2 and T3 for transmission modes. The interference may be substantially eliminated by using a wavelength regime in which the masking layer is absorbing, such as a deep UV wavelength. Optical monitoring of etching is then determined by the layer being etched and from its exposure fraction. Thin film interference between the top and the bottom of the masking layer is substantially eliminated by using wavelength from a light source that is absorbed by the photoresist, as shown by the absence of the components of R3 and T3.

Alternatively, all optical transmission and reflection signals clearly show endpoint during etching of an unpatterned workpiece (e.g., a photomask or wafer), a patterned etch mask can create difficulties in determining endpoint. The optical signal can be confounded by the presence of thin film optical interference caused by concurrent thinning of the masking layer while the etching layer is etched. Transmission is more immune to this problem than reflection, especially if the etching layers are substantially opaque, as in the case for thick chromium layers, e.g., chromium layers having a thickness greater than 100 nm. As technology moves to thinner layers, specifically layers of chromium having a thickness less than 50 nm, inherent absorption is reduced and the advantage is accordingly reduced as well. For the case of phase shifting photomasks with an additional absorbing layer such as MoSi, the advantage is further reduced. However, by choosing a deep UV wavelength to monitor reflection and transmission, the confounding interference from the masking layer is virtually eliminated. This occurs when the optical length is short enough that the absorbance of the masking layer is significant, thereby spoiling the interference. This will occur for light at wavelengths less than 240 nm for DUV resist, such as FEP 171.

Figure 18:
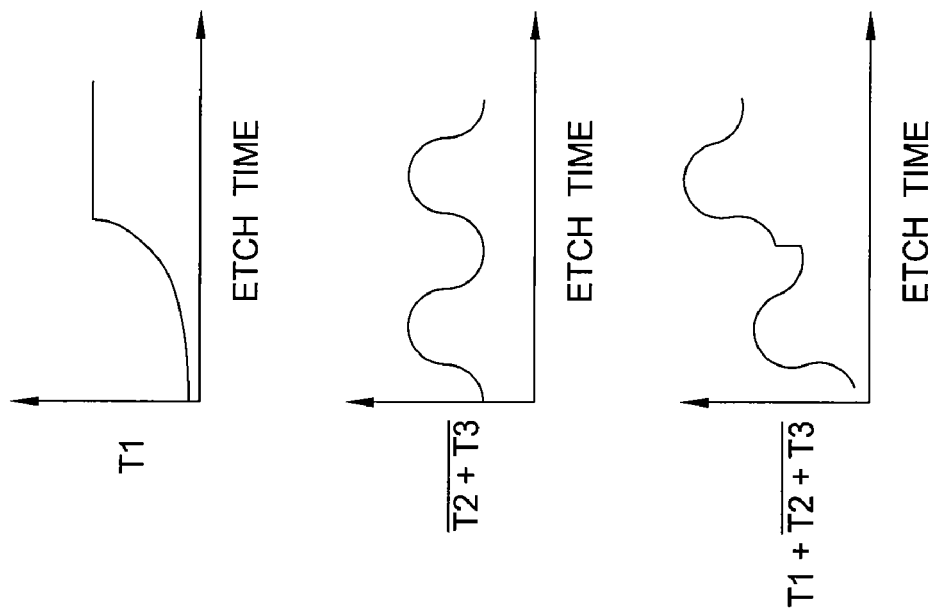
FIG. 18 depicts the magnitude of the transmission signals T1, T2 and T3 shown in FIG. 16.
Figure 16:
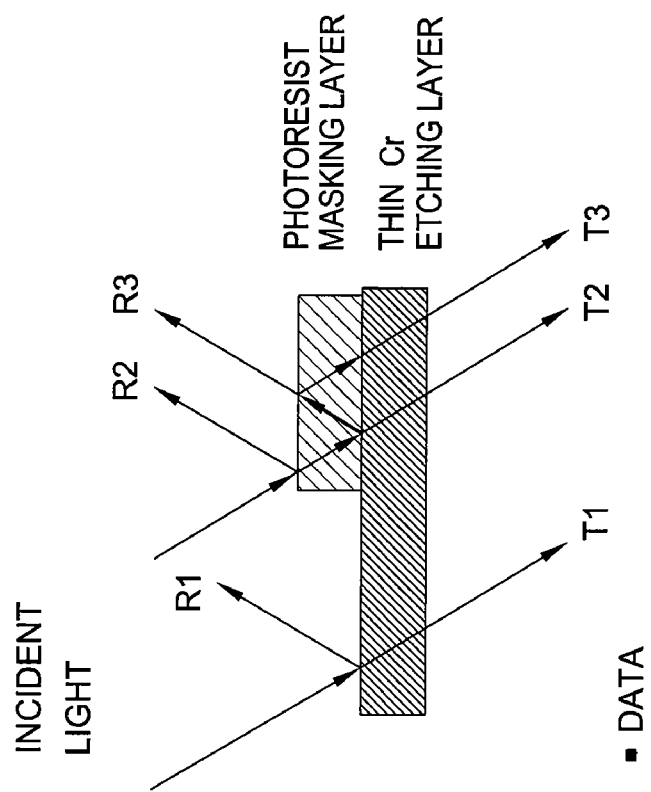
Figure 17:
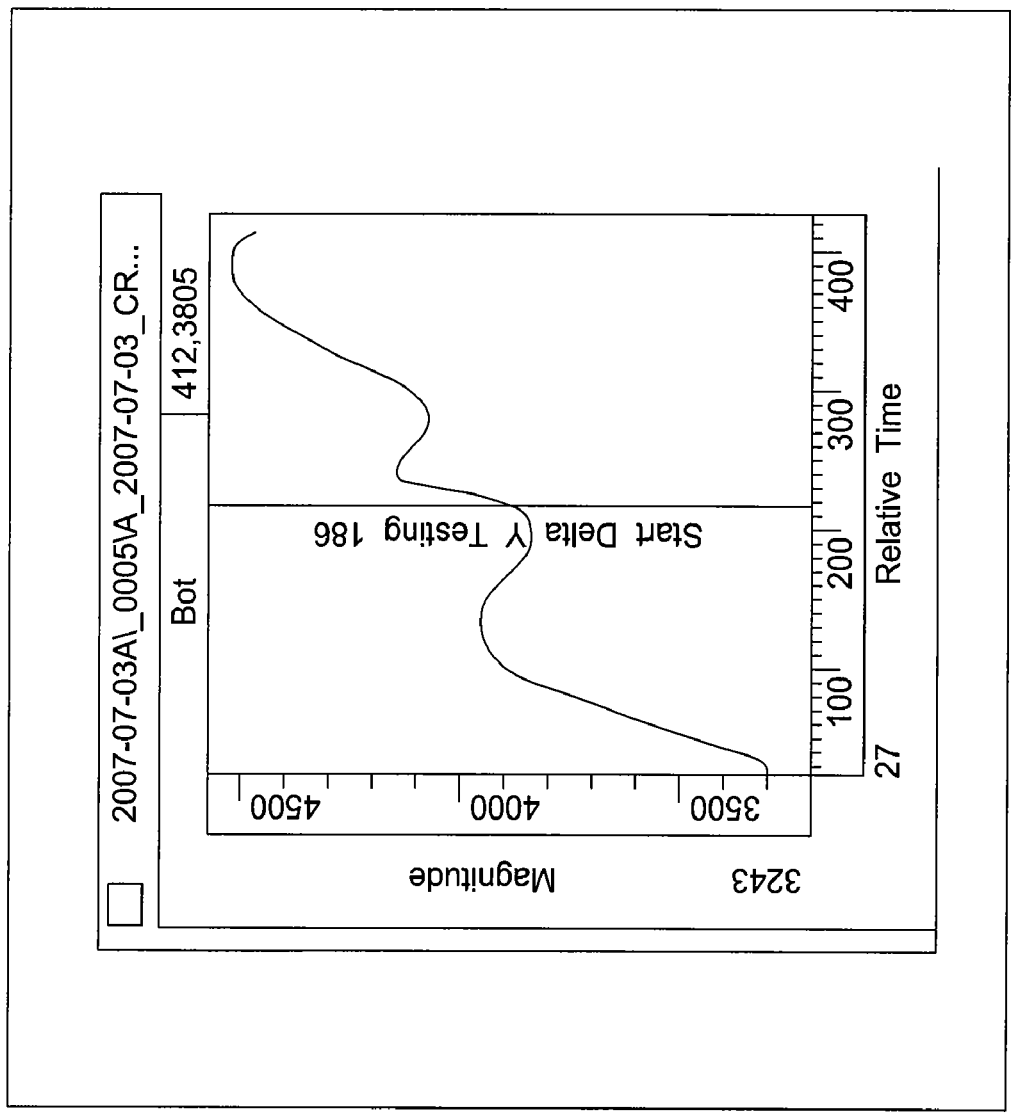
FIG. 17 shows endpoint data which demonstrates the combined transmission from the component signals shown in FIG. 18.

FIGS. 16, 17 and 18 are illustrative of the optical interference of the photoresist. FIG. 16 is a schematic showing the optical interference components T2 and T3. FIG. 18 depicts the magnitude of the transmission signals T1, T2 and T3. FIG. 18 illustrates the measured transmission signal depicted in the graph of FIG. 17 as being the superposition of the transmission signal T1 and the vector added signals T2 and T3.

Figure 21:
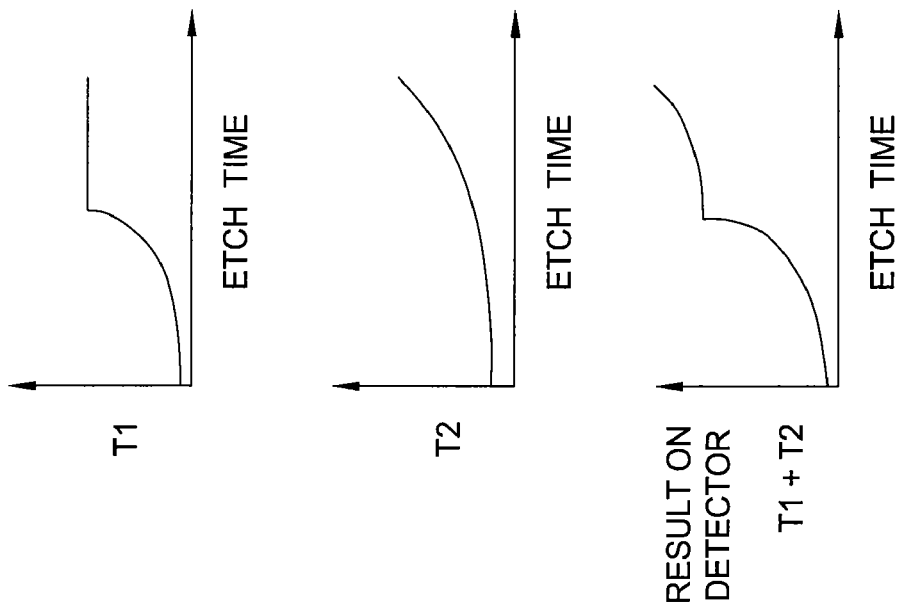
FIG. 21 depicts the magnitude of the transmission signals T1 and T2 shown in FIG. 19 and demonstrated in the data of FIG. 20.
Figure 19:
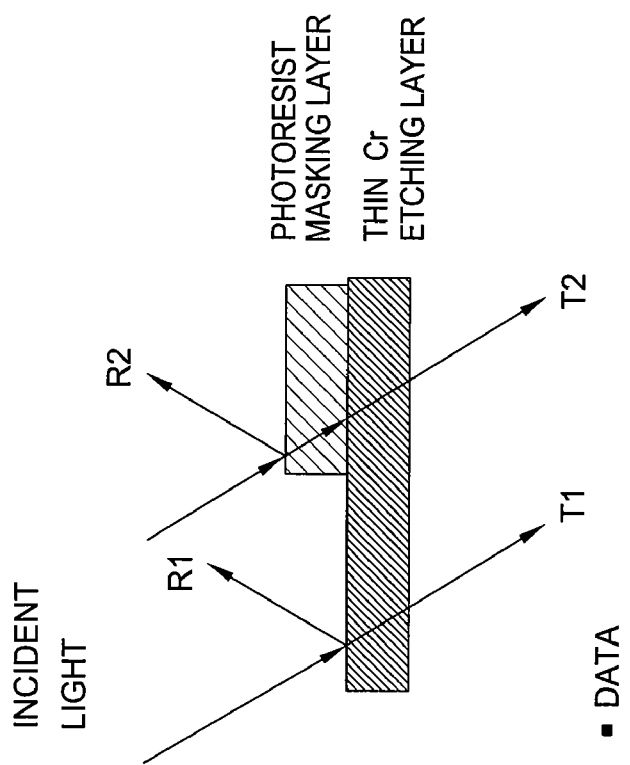
FIGS. 19-20 are illustrative of an etching process utilizing an endpoint monitoring signal by using a wavelength that is absorbed by the photoresist layer.
Figure 20:
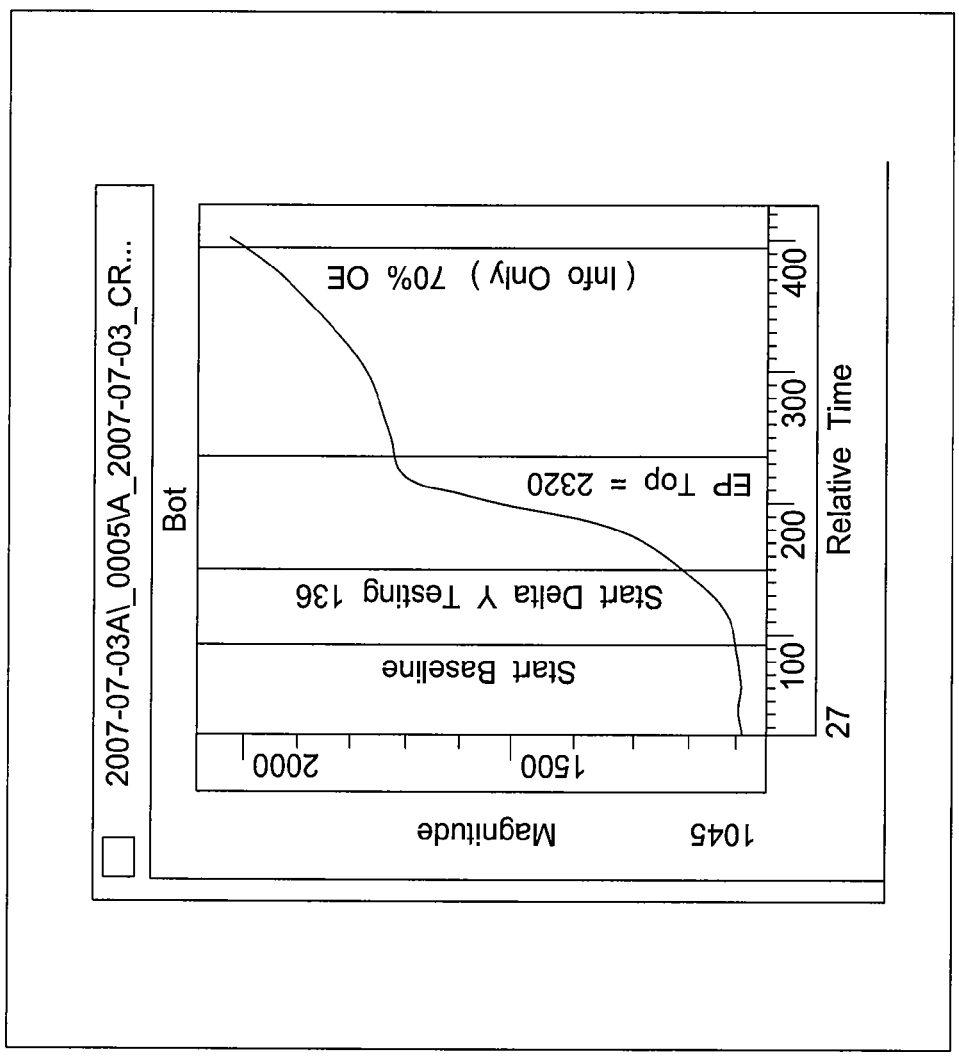
Figure 22:
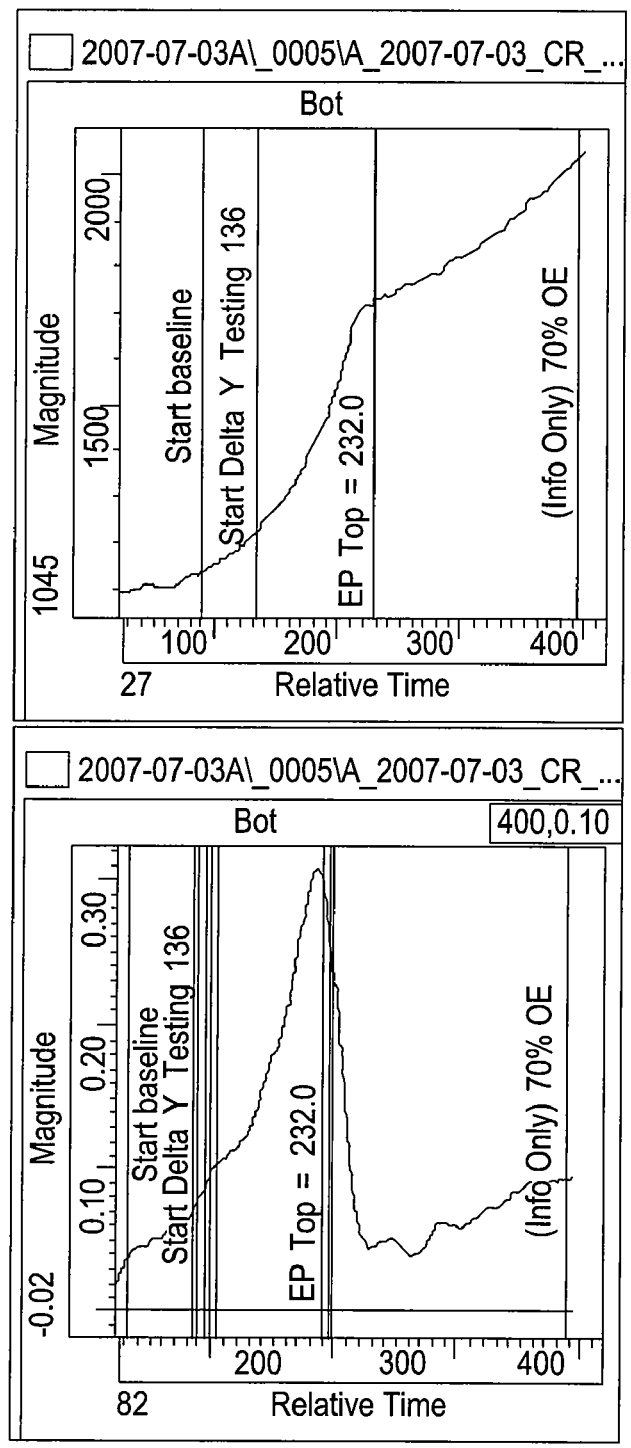
FIG. 22 is another graph of endpoint data obtained during one embodiment of a photomask reticle etching process using deep UV signal and its derivative.

FIGS. 19, 20 and 21 are illustrative of an etching process utilizing an endpoint monitoring signal by using a wavelength that is absorbed by the photoresist layer. As depicted in FIG. 19, the incident light absorbed by the photoresist masking layer will not generate an interference between the top and the bottom of the masking layer, specifically components R3 and T3 are eliminated. Thus, the resultant signal monitored by the detector, as shown in the graph of FIG. 20, is easier to analyze. As the chromium layer being etched becomes less than 20 nm, the signal rises faster until the chromium layer clears and the transmission signal becomes flat, and as such, the resultant signal obtained by the detector is indicative of thickness and/or presence of photomask masking layer and/or chromium layer as seen in FIG. 21. Thus, the endpoint of the chromium etch can be identified when the slope of the signal decreases. The endpoint can be called using a sequence of derivative calculation and smoothing of the data to determine when the slope decreases. Such endpoint determination is illustrative in the endpoint traces provided in FIG. 22.

Figure 23:
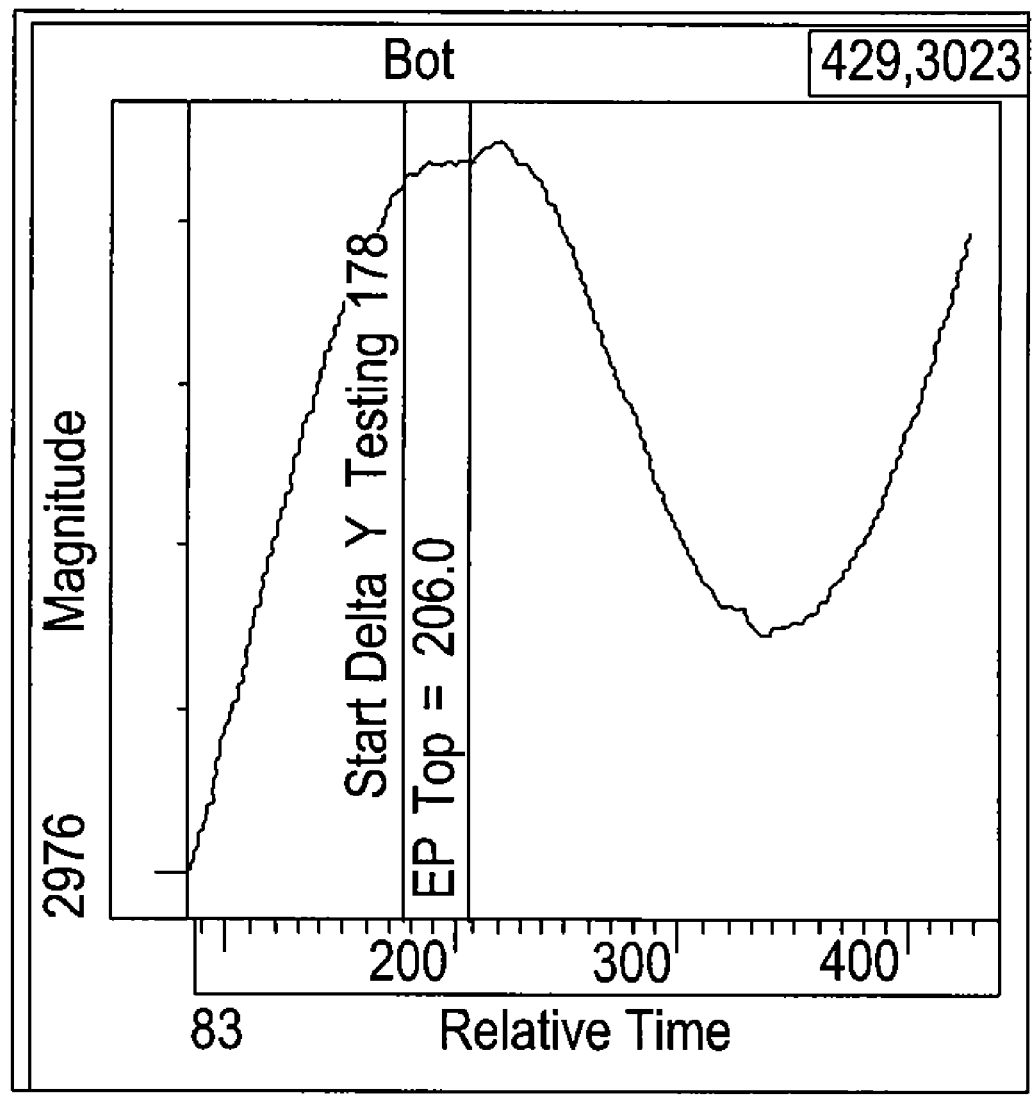
FIG. 23 depicts an endpoint signal dominated by optical interference from a photoresist layer.

The use of deep UV wavelength monitoring signals is particularly useful in etch applications having low open area. For example, FIG. 23 depicts an endpoint signal dominated by optical interference from the photoresist layer. The endpoint of the chromium etch is not readily visible from the signal depicted in FIG. 23. By utilizing deep UV wavelength monitoring signals, the endpoint is readily ascertainable as the slope of the trace visibly decreases at the 260second mark, as shown by trace 2402, as shown in FIG. 24. By using a derivative of the deep UV endpoint signal, the endpoint is also ascertainable at the 260second mark, as indicated after the peek signal of trace 2404, as shown in FIG. 24.

The use of fiber optics can also improve deep UV endpoint applications. Conventional UV transmitting fiber optics generally attenuate the signal at wavelengths below 235 nm. Non-solarizing fibers may be utilized to improve transmission below 235 nm wavelengths. Thus, the signal to noise ratio would increase, thereby extending the endpoint capability to smaller, open areas.

Figure 25:
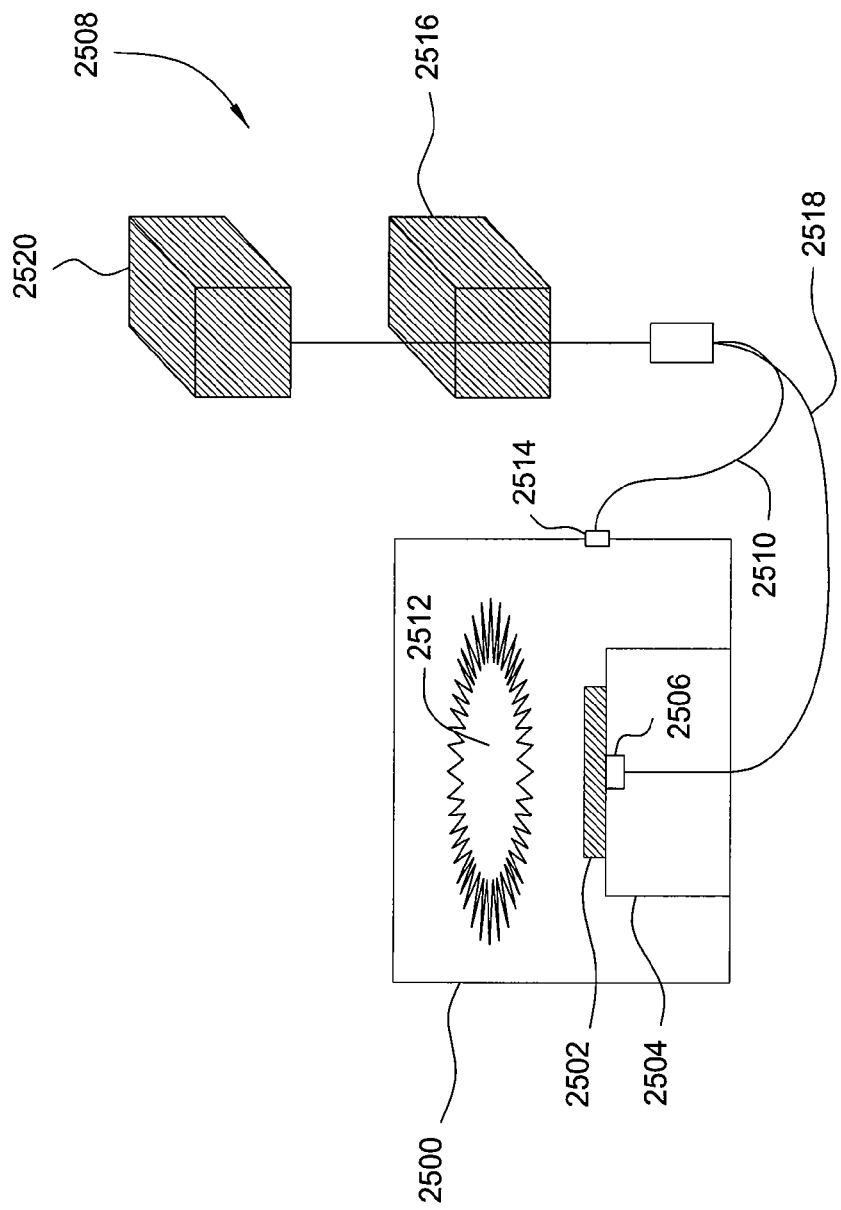
FIG. 25 is a schematic diagram of one embodiment of a processing chamber for etching a photomask reticle and having an endpoint detection system that utilizes both OES and TEP endpoint information.

FIG. 25 illustrates a processing chamber 2500 having a photomask reticle 2502 supported on a pedestal 2504. The pedestal has one or more windows 2506 through which the bottom of the photomask reticle 2502 may be viewed by an endpoint detection system 2508. The endpoint detection system 2508 includes a side fiber optic bundle 2510 which views a plasma 2512 disposed in the chamber 2500 through a window 2514 disposed in the side of the chamber. The side fiber optical bundle 2510 provides OES information of the plasma 2512 to a detector 2516, such as a spectrometer. A second fiber optic bundle 2518 views the bottom of the substrate through the window 2506 in the pedestal 2504. In the fiber optic bundle 2518 are made from non-solarizing deep UV fused silica for enhanced transmission of signals at wavelengths below 235 nm. Optionally, the endpoint detection system 2508 may include a lamp 2520 to provide light through the fiber bundle 2518 to obtain information in a reflection mode.

Figure 26:
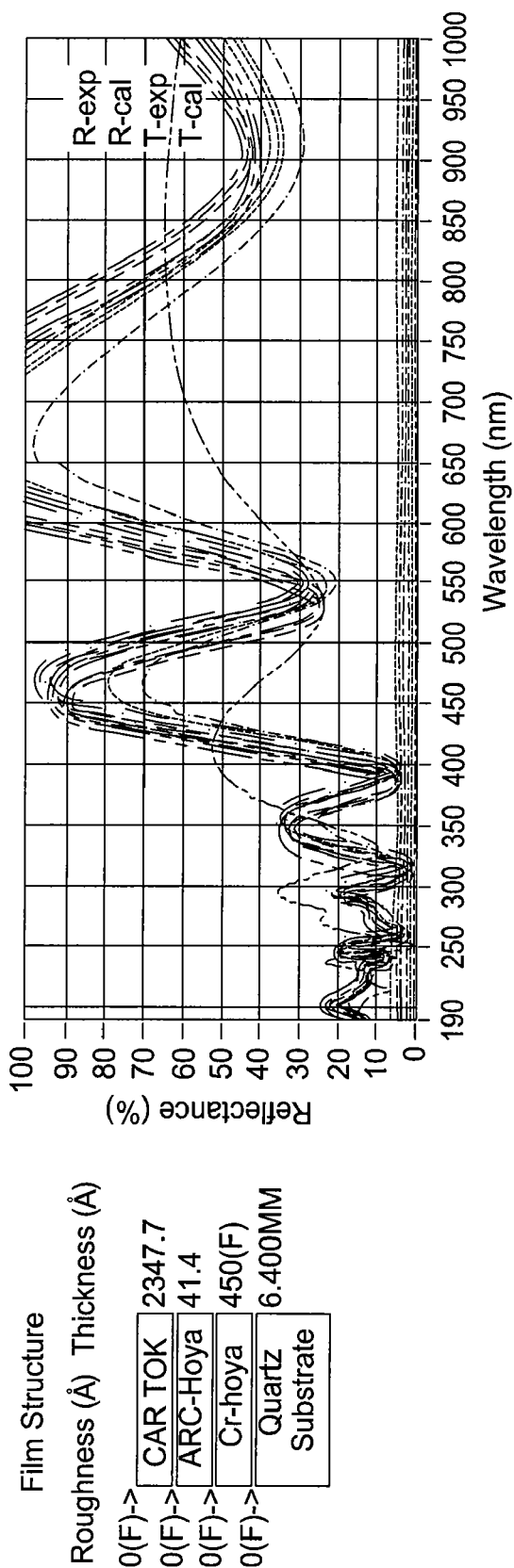
FIG. 26 shows optical reflection and transmission curves for photoresist on a mask showing increased absorption in the deep-UV portion of the spectrum.

FIG. 26 depicts a graph illustrative of the benefits of the choice of wavelengths for photoresist absorption. The graph illustrates that for wavelengths below 240 nm, the interference fringes disappear because the higher absorption constant eliminates multi-path reflection. Thus, the selection of the proper wavelength for use as an endpoint detection monitoring a vehicle for enhancing in-situ reflection transmission for endpoint and process monitoring. Reduced photomask interference facilitates accurate endpoint determination for low, open area applications, such as contact patterns. This method also facilitates acquiring measurement information of the actual process at specific areas, including discrete local areas, and is not limited to endpoint detection determined over a large area. This enables the process to be adjusted to tune the etch rate at specific locations. The use of deep UV monitoring signals benefits both reflection and transmission modes of endpoint detection. As such, these techniques can be extended for use on conventional wafer etching (top reflection), as well as photomask (top reflection, bottom reflection and bottom transmission) etching.

In another embodiment, endpoint hardware (cathode with multiple windows underneath the etching substrate (e.g., photomask)), multiple substrate detection locations can be used in conjunction with the substrate pattern to determine the substrate orientation. Once the substrate orientation is known, the existing process uniformity signature may be modified to improve the final etch performance. For example, if the substrate has been inserted in the chamber with a vertical orientation, and the etch pattern has a top-down component, the process can be dynamically changed to have more of a side-side component. This will result in improved etch uniformity. The process change can be performed by modifying part of the recipe while running. The process change could, for example, entail use of the dynamic phase adjustment or change in another processing variable and/or process knob. In another example, if there is a change in orientation between substrates, then the process may be adjusted to accommodate the change and provide between substrate uniformity.

An example processing sequence (for a photomask substrate) may include: A) providing a mask pattern having two openings on the left and right edges; B) providing an endpoint system set up to simultaneously collect data from window under the left edge and window under the top edge of the substrate; C) when the mask is inserted into the tool, the signals from the top and right locations are analyzed to determine which one is under an opening that is being etched; D) the recipe can be modified to accommodate the mask orientation for improved etch performance. Exemplary benefits of having additional substrate sensors coordinated with the mask pattern include, an endpoint can be performed despite etch orientation of the mask; signals from the two perimeter locations can be summed to form a robust endpoint signal; signals can be analyzed to determine which one matches the mask pattern and hence mask orientation; mask orientation can be used to modify the current recipe to produce an improved process result (e.g., better etch uniformity).

In one embodiment, an implementation may include A) new optical fiber bundle split 3-ways, which allows monitoring two locations in the cathode (of the existing 4 windows), as well as OES (optical emission spectroscopy) from a side window; B) The CCD endpoint system firmware enables simultaneous collection of 3 channels of information. This is accomplished by changing the mapping of the CCD pixels in the imaging spectrometer; D) three data streams are analyzed to decide which signal to use for endpoint (or to sum or otherwise combine the signals to form a robust endpoint); D) The new algorithm may feed back the mask orientation to the etch system, and the etch system (e.g. process recipe) may make a process change during the remainder of the etch to improve the final result.

This could be useful for wafer process applications if the wafer orientation is variable and process results can be improved by a recipe change based on the determined orientation.

In another embodiment, etch process uniformity may be determined by 1) comparing endpoint times from different spatial locations on the substrate being etched, and/or comparing etch rates from different spatial locations, and 2) adjusting the process accordingly.

The endpoint hardware (three-way optical fiber cable combined with the cathode with multiple windows underneath the etching substrate (e.g., photomask)), multiple detection locations can be used in conjunction with the substrate pattern to determine the process uniformity. If the monitoring shows some process non-uniformity, the process can be modified to improve the final etch performance.

For example, if the monitored etch pattern has a top-down component, the process or hardware can be changed to reduce the top-down component. This can be done as part of a chamber setup/startup process, or possibly in real time with the process adjusted during the remainder of the etch.

The number of locations monitored could be increased by adding a plurality of windows and a plurality of detectors. In practice, the existing CCD imaging spectrometer is limited to detecting three (maximum 7, with added noise) independent signals. If a second spectrometer is added ("Dual Spectrometer Endpoint"), then a total of six signals, one OES from the side of the chamber, and five under the mask, can be detected. A layout of five locations is useful to get basic top-down, side-side, and center-fast or center-slow process information. This information is also useful for wafer process applications if the wafer orientation is variable and process results can be improved by a recipe change based on the determined orientation of the substrate (e.g., photomask) relative to the substrate support.

Optical monitoring of etching may often be confused by signal arising from the mask layer etching, rather than that of the etch layer itself. By using a wavelength regime in which the masking layer is absorbing, such as deep UV for the case of photoresist masking layers, optical monitoring of etching is then determined by the layer being etched, and from its exposed area fraction. Optical interference effects from the thinning resist are then no longer present.

This embodiment may be described in two parts. The first part is the selection of an absorbing wavelength for the masking layer (<240 nm for the case of photoresist). The second part is the hardware improvement of increasing deep UV transmission in the optical system to provide the ability to choose deep UV wavelengths with good signal-to-noise performance. One hardware improvement is the use of a non-solarizing deep UV optical fiber with better transmission below 240 nm wavelength. Additionally or alternatively, the detector may be placed closer to the chamber to remove the requirement of the transmission-limiting fiber, or use free-space optics or hollow fiber-optics.

This method can be used to monitor reflection as well as transmission, so its use can also apply to absorbing substrates, transparent etching layers on absorbing substrates. The transmission and reflection modes can be used for wafers as well as photomask reticle.

Additional features of the invention are described in the attached appendix following the drawings.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    etching a photomask reticle disposed on a substrate support in a plasma etch chamber;
    obtaining a first signal indicative of light collected through a first window of the substrate support, the first window disposed below a center of the photomask reticle;
    obtaining a second signal indicative of light collected through a second window of the substrate support, the second window disposed below a first edge of the photomask reticle;
    obtaining OES information collected through a sidewall of the etch chamber;
    normalizing at least one of the signals using the OES information;
    determining from the normalized signal and an optical thin film model at least one of an etch rate or thickness of a chromium layer disposed on the photomask reticle; and
    determining a parameter of etching the photomask reticle using the OES information and at least one of the obtained signals.

2. The method of claim 1 further comprising:
    determining from the normalized signal and an optical thin film model at least one of an etch rate or thickness of a resist layer disposed on the photomask reticle.

3. The method of claim 1 further comprising:
    determining from the normalized signal and an optical thin film model an etch selectivity between a resist layer and a chromium layer disposed on the photomask reticle.

4. The method of claim 1, wherein the parameter is at least one of etch rate or endpoint.

5. The method of claim 1 further comprising:
obtaining a third signal indicative of light collected through a third window of the substrate support, the third window disposed below a second edge of the photomask reticle.

6. The method of claim 1 further comprising:
adjusting etching of the photomask reticle in response to the OES information and the obtained signals.

* * * * *